(12) United States Patent
Olsson et al.

(10) Patent No.: US 7,385,334 B1
(45) Date of Patent: Jun. 10, 2008

(54) CONTOUR MODE RESONATORS WITH ACOUSTIC REFLECTORS

(75) Inventors: Roy H. Olsson, Albuquerque, NM (US); James G. Fleming, Albuquerque, NM (US); Melanie R. Tuck, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 65 days.

(21) Appl. No.: 11/602,011

(22) Filed: Nov. 20, 2006

(51) Int. Cl.
*H01L 41/08* (2006.01)
(52) U.S. Cl. .............. 310/322; 310/324; 310/334; 310/309; 333/189
(58) Field of Classification Search ........... 310/309, 310/320, 322, 324, 334; 333/189
See application file for complete search history.

(56) References Cited

U.S. PATENT DOCUMENTS

| | | | |
|---|---|---|---|
| 5,804,084 A | 9/1998 | Nasby et al. | |
| 6,542,054 B2 * | 4/2003 | Aigner et al. | 333/187 |
| 6,603,241 B1 | 8/2003 | Barber et al. | |
| 6,720,844 B1 * | 4/2004 | Lakin | 333/189 |
| 6,841,922 B2 * | 1/2005 | Aigner et al. | 310/335 |
| 6,933,807 B2 * | 8/2005 | Marksteiner et al. | 333/187 |
| 7,138,889 B2 * | 11/2006 | Lakin | 333/189 |
| 2002/0022292 A1 | 2/2002 | Barber et al. | |

OTHER PUBLICATIONS

B. Antkowiak et al, "Design of a High-Q, Low-Impedance, GHZ-Range Piezoelectric MEMS Resonator", The 12th International Conference on Solid State Sensors, Actuators and Microsystems, Boston, Jun. 8-12, 2003, pp. 841-846.

Gianluca Piazza and Albert P. Pisano, "Dry-Released Post-CMOS Compatible Contour-Mode Aluminum Nitride Micromechanical Resonators for VHF Applications", Presented at 2004 Solid-State Sensor, Actuator and Microsystems Workshop, Hilton Head Island, SC, 2004, pp. 37-40.

Sheng-Shian Li et al, "Micromechanical "Hollow-Disk" Ring Resonators" Proceedings, 17th Int. IEEE Micro Electro Mechanical Systems Conf. Masstricht, The Netherlands, Jan. 25-29, 2004, pp. 821-824.

Robert Aigner, "Volume manufacturing of BAW-filters in a CMOS fab", Proceedings of the 2nd International Symposium on Acoustic Devices for Future Communication Systems, Chiba University, Japan, Mar. 3-5, 2004, pp. 129-134.

(Continued)

*Primary Examiner*—Mark Budd
(74) *Attorney, Agent, or Firm*—John P. Hohimer

(57) ABSTRACT

A microelectromechanical (MEM) resonator is disclosed which has a linear or ring-shaped acoustic resonator suspended above a substrate by an acoustic reflector. The acoustic resonator can be formed with a piezoelectric material (e.g. aluminum nitride, zinc oxide or PZT), or using an electrostatically-actuated material. The acoustic reflector (also termed an acoustic mirror) uses alternating sections of a relatively low acoustic impedance $Z_L$ material and a relatively high acoustic impedance $Z_H$ material to isolate the acoustic resonator from the substrate. The MEM resonator, which can be formed on a silicon substrate with conventional CMOS circuitry, has applications for forming oscillators, rf filters, and acoustic sensors.

26 Claims, 21 Drawing Sheets

OTHER PUBLICATIONS

G. Piazza et al, "Low Motional resistance Ring-Shaped Contour-Mode Aluminum Nitride Piezoelectric Micromechanical Resonators for UHF Applications," Proceedings of the 18th IEEE International Conference on Micro Electro Mechanical Systems, 2005, Jan. 30-Feb. 3, 2005, pp. 20-23.

Wei Pang et al, "Micromachined Acoustic Wave Resonator Isolated from Substrate," IEEE Transactions on Ultrasonics, Ferroelectrics, and Frequency Control, vol. 52, No. 8, Aug. 2005, pp. 1239-1246.

P.J. Stephanou et al, "Design of novel mechanical coupling for contour mode piezoelectric RF MEMS filters," Journal of Physics: Conference Series, vol. 34, International MEMS Conference, May 9-12, 2006, Singapore, pp. 342-349.

Yu-Wei Lin et al, "Vibrating Micromechanical Resonators with Solid Dielectric Capacitive Transducer Gaps," Proceedings of the 2005 IEEE International Frequency Control Symposium and Exposition, Aug. 29-31, 2005, pp. 128-134.

\* cited by examiner

Section 1 - 1

CONTOUR MODE RESONATORS WITH ACOUSTIC REFLECTORS

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to microelectromechanical (MEM) resonators, and in particular to MEM resonators which incorporate an acoustic reflector (also termed an acoustic mirror) to acoustically isolate the MEM resonators from a substrate on which they are formed.

BACKGROUND OF THE INVENTION

Bulk acoustic wave devices, which can be used as resonators for radio frequency (rf) filters, have heretofore been formed as discrete components due to their incompatibility with conventional complementary-metal oxide-semiconductor (CMOS) fabrication processes. It would be very desirable in terms of reduced cost and size to be able to fabricate a bulk acoustic resonator directly on a silicon or silicon-on-insulator (SOI) substrate.

Efforts to do this have been underway for several years to produce film bulk acoustic resonators (FBARs) which are compatible with CMOS processing (see e.g. R. Aigner, "Volume Manufacturing of BAW-Filters in a CMOS Fab," *Proceedings of the 2nd International Symposium on Acoustic Devices for Future Mobile Communication Systems*, Chiba University, Japan, pp. 129-134, Mar. 3-5, 2004). However, such FBARs are limited in that multiple resonators operating at different frequencies cannot easily be fabricated on a common substrate since the film thickness of the piezoelectric material sets the operating frequency so that all the FBARs formed on a common substrate generally have the same operating frequency.

More recently, contour mode aluminum nitride (AlN) resonators have been reported that utilize the $d_{31}$ piezoelectric coefficient, which provides an in-plane lateral displacement, for electrical drive and sense (see e.g. G. Piazza et al., "Dry-Released Post-CMOS Compatible Contour-Mode Aluminum Nitride Micromechanical Resonators for VHF Applications," *Proceedings of the* 2004 *Solid-State Sensor, Actuator and Microsystems Workshop*, Hilton Head Island, S.C., pp. 37-40, 2004; G. Piazza et al., "Low Motional Resistance Ring-Shaped Contour-Mode Aluminum Nitride Piezoelectric Micromechanical Resonators for UHF Applications," *Proceedings of the* 18th *IEEE International Conference on Micro Electro Mechanical Systems* 2005, pp. 20-23, Jan. 30-Feb. 3, 2005). The use of contour modes, with frequencies determined by in-plane dimensions rather than by layer thickness, enables the fabrication of multiple resonators with different frequencies on a common substrate. However, these contour mode resonators are supported by tethers anchored to the substrate. The tethers provide relatively poor heat sinking to the substrate, and this limits the power handling capability of these contour mode resonators. Additionally, the tethers provide a discontinuity which can distort the shape of the contour mode and produce spurious modes even when notching about the tethers is used. These effects produced by the tethers become more pronounced as the size of the contour mode resonators is reduced to increase the operating frequency.

The present invention can overcome many of the limitations of the prior art by providing a MEM resonator having an acoustic resonator which is suspended from a substrate by an acoustic reflector. The acoustic reflector can provide an increased heat sinking capability for the device, while providing acoustic isolation from the substrate. The acoustic reflector can also support the acoustic resonator over a relatively large area without distorting the shape of a contour mode therein.

These and other advantages of the present invention will become evident to those skilled in the art.

SUMMARY OF THE INVENTION

The present invention relates to a microelectromechanical (MEM) resonator which comprises a substrate; an acoustic resonator suspended on the substrate (e.g. over a cavity formed in the substrate) to produce a resonant acoustic signal in response to an electrical actuation; and an acoustic reflector located between the acoustic resonator and the substrate to provide an acoustic isolation of the acoustic resonator. The acoustic resonator can comprise a piezoelectric material (e.g. aluminum nitride), or alternately an electrostatically-activated material. A plurality of electrodes can be provided on the acoustic resonator for electrical actuation thereof, or for sensing an oscillatory electrical output signal generated in the acoustic resonator by the resonant acoustic signal.

The acoustic reflector (also referred to as an acoustic mirror) can be formed as a cantilevered plate extending substantially parallel to the substrate. The acoustic reflector can further comprise a plurality of elongate regions of two different materials (e.g. tungsten and silicon dioxide, tungsten and aluminum nitride, or tungsten and silicon) which are arranged side-by-side in an alternating arrangement. Each elongate region within the acoustic reflector can have a width substantially equal to a one-quarter wavelength ($\lambda/4$) of the resonant acoustic signal, or an odd multiple of $\lambda/4$. The acoustic reflector can be separated from the substrate by an air gap (e.g. formed by the cavity in the substrate).

The substrate can comprise silicon (e.g. a silicon substrate, or a silicon-on-insulator substrate). This is particularly advantageous when the MEM resonator is to be fabricated with CMOS circuitry on the same substrate.

The present invention also relates to a MEM resonator which comprises a substrate (e.g. comprising silicon), with an acoustic resonator suspended on the substrate and having a ring shape, and with the acoustic resonator producing a resonant acoustic signal in response to an electrical actuation thereof. An acoustic reflector can be located between the acoustic resonator and the substrate to provide an acoustic isolation of the acoustic resonator. The acoustic reflector can have a ring shape and can further comprise a plurality of nested rings of two different alternating materials (e.g. tungsten and silicon dioxide, tungsten and aluminum nitride, or tungsten and silicon). The acoustic resonator can comprise a piezoelectric material (e.g. aluminum nitride), or alternately an electrostatically-activated material. The acoustic resonator can also be suspended over a cavity formed in the substrate, and can include a plurality of electrodes to provide the electrical actuation to produce the resonant acoustic signal, and also to provide an oscillatory electrical output signal generated in the acoustic resonator by the resonant acoustic signal.

The acoustic reflector can have a substantially uniform thickness, with each nested ring therein having a width which is substantially equal to a one-quarter wavelength (λ/4) of the resonant acoustic signal, or an odd multiple of λ/4. The acoustic resonator can be separated from the substrate by an air gap formed by the cavity in the substrate. The term "air gap" as used herein refers to a space filled by a gas or vacuum.

The present invention further relates to a MEM resonator which comprises a substrate having a cavity formed therein; an acoustic reflector formed as a plate and suspended at least partially over the cavity, and further comprising a plurality of elongate regions of a first material and a second material arranged side-by-side, with each elongate region having a width substantially equal to one-quarter of an acoustic wavelength; and an acoustic resonator attached to the acoustic reflector and suspended over the cavity to produce a resonant acoustic signal, with the acoustic resonator being substantially acoustically isolated from the substrate by the acoustic reflector. The acoustic resonator preferably comprises a contour mode resonator. The acoustic resonator can further have a ring shape, and can be formed of aluminum nitride (AlN). The first and second materials used in the acoustic reflector can comprise tungsten and a material selected from the group consisting of silicon dioxide, silicon nitride and silicon.

The present invention also relates to a MEM resonator which comprises a substrate; a ring resonator extending outward over a cavity formed in the substrate to generate or detect a resonant acoustic signal; and an acoustic reflector located between the ring resonator and the substrate to acoustically decouple the ring resonator from the substrate, with the acoustic reflector further comprising a plurality of nested rings having two different alternating acoustic impedances, and with a width of each nested ring being substantially equal to a one-quarter wavelength of the resonant acoustic signal.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1A:
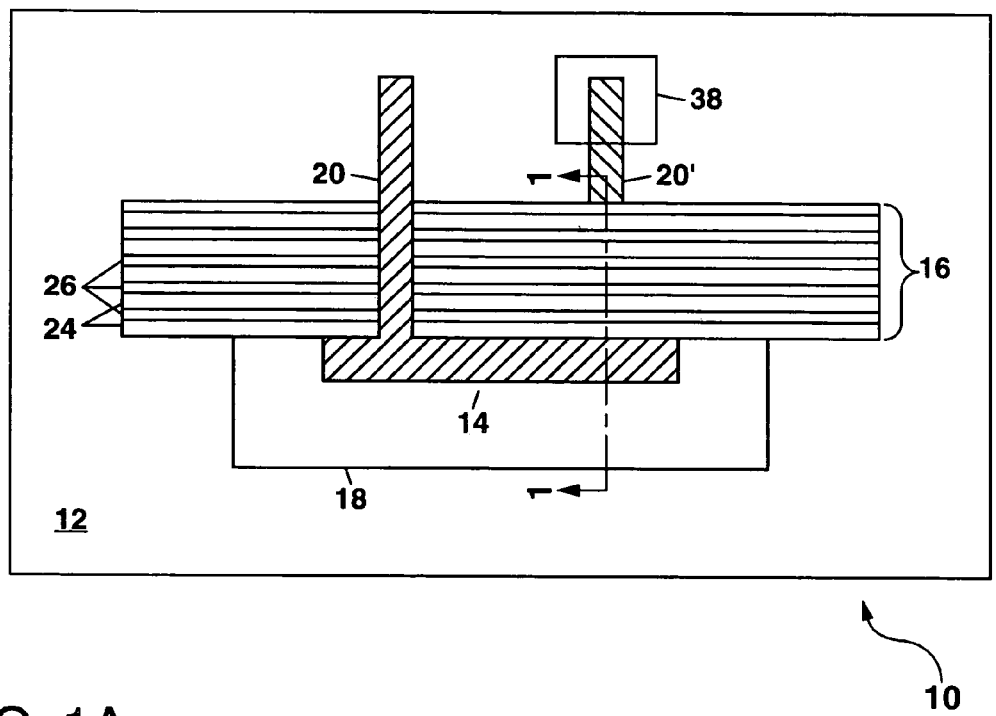
FIGS. 1A and 1B show schematic plan and cross-section views, respectively, of a first example of a MEM resonator of the present invention.
Figure 1B:
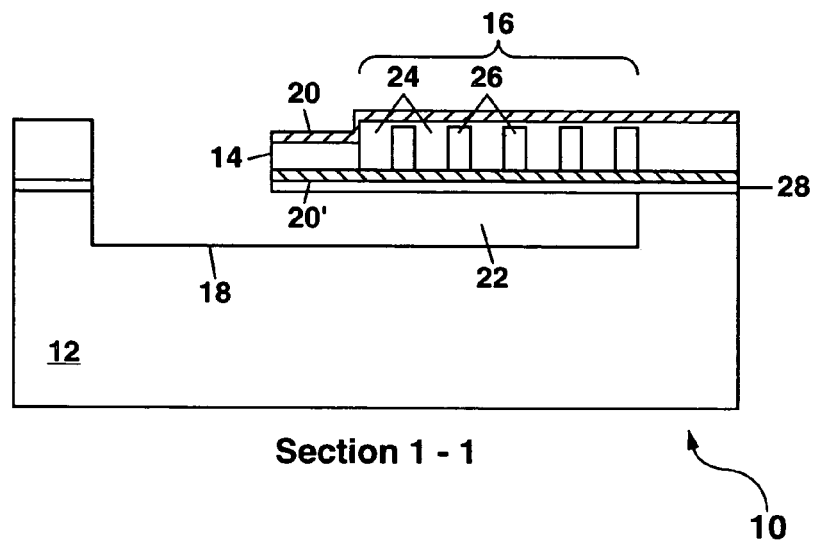

Referring to FIGS. 1A and 1B, there is shown a schematic plan view and a schematic cross-section view, respectively, of a first example of a MEM resonator 10 formed according to the present invention. The MEM resonator 10 comprises a substrate 12 with an acoustic resonator 14 suspended thereon by an acoustic reflector 16. The acoustic resonator 14 and at least a part of the acoustic reflector 16 extend outward over a cavity 18 formed in the substrate 12, with the acoustic reflector 16 being formed as a cantilevered plate extending substantially parallel to the substrate 12 and having a thickness of up to a few microns (e.g. 1-5 μm). In this way, the acoustic resonator 14 can be acoustically isolated from the substrate 12 by the acoustic reflector 16 while still being thermally coupled to the substrate 12 through the acoustic reflector 16. Any heat generated within the acoustic resonator 14 by electrical actuation thereof can be dissipated through the acoustic reflector 16 to the substrate 12 which serves as a heat sink.

The acoustic resonator 14 in the example of FIGS. 1A and 1B preferably comprises a piezoelectric material and operates as a contour mode resonator. Suitable piezoelectric materials that can be used for the acoustic resonator 14 are, for example, aluminum nitride (AlN), zinc oxide (ZnO) and PZT ($PbZr_xTi_{1-x}O_3$). Of particular interest is aluminum nitride since this material is compatible with conventional CMOS processing so that the acoustic resonator 14 can be used to construct oscillators, rf filters, acoustic sensors, etc., on the substrate 12 in combination with integrated electronic circuitry (not shown) comprising a plurality of interconnected transistors formed on the same substrate 12.

Oscillation of the acoustic resonator 14 in a contour mode can be achieved by utilizing the $d_{31}$ piezoelectric coefficient for electrically driving the acoustic resonator 14, and also for sensing its oscillation. Contour mode oscillation produces standing acoustic waves which are oriented in a lateral (i.e. in-plane) direction along the width or length or both of the resonator 14, and are to be contrasted to bulk acoustic waves in an FBAR device which are oriented in a vertical (i.e. out-of-plane) direction along the height of a piezoelectric resonator.

With electrical actuation of the MEM resonator 10 in FIGS. 1A and 1B by an oscillatory voltage V applied between an upper electrode 20 and a lower electrode 20' of the acoustic resonator 14, an in-plane extensional mechanical stress is produced in the piezoelectric material therein through the $d_{31}$ piezoelectric coefficient. This changes the width of the acoustic resonator 14 in the direction substantially parallel to the substrate 12, with a maximum in-plane dilation being obtained at resonance for a particular contour mode (e.g. a fundamental mode or a higher order mode). Oscillation of the acoustic resonator 14 can occur at frequencies up to 1 GHz or more, with the exact oscillation frequency being defined by the width of the acoustic resonator 14 and the particular contour mode which is stimulated. The acoustic resonator 14 in the example of FIGS. 1A and 1B generally has a width which is substantially equal to one-half wavelength (i.e. $\lambda/2$) of an acoustic resonance frequency of the MEM resonator 10, or a multiple of $\lambda/2$ (i.e. $n\lambda/2$ where n=1, 2, 3, . . . ).

For a device 10 such as that shown in FIGS. 1A and 1B which is designed primarily for oscillation in width-extensional contour modes, the length of the acoustic resonator 14 can be arbitrary. In such a device 10, the length can be selected to provide a particular value of motional impedance for matching to electrical drive or sense circuitry. This can be advantageous to provide a low impedance for high speed operation. As an example, the width of the acoustic resonator 14 in FIGS. 1A and 1B can be 1-10 μm; and the length can be 100-200 μm. The thickness of the acoustic resonator 14 can be, for example, on the order of 1 micron or less (e.g. 0.75 μm).

The MEM resonator 10 in FIGS. 1A and 1B can be operated as a one-port device, with the upper and lower electrodes 20 and 20' being used to electrically actuate the resonator 14 with an oscillatory voltage V to produce a resonant acoustic signal therein, and also to sense its response as the resonant acoustic signal is converted back into an oscillatory electrical output signal by action of the piezoelectric material in the resonator 14. In other embodiments of the present invention the MEM resonator 10 can be formed as a two-port device with one set of electrodes for electrical actuation of the acoustic resonator 14, and with another set of electrodes for sensing the generated oscillatory electrical output signal (see FIGS. 3A and 9A, 9B).

In the example of FIGS. 1A and 1B, the cavity 18 provides an air gap 22 between the acoustic resonator 14 and the underlying substrate 12 to acoustically isolate the resonator 14 from the substrate 12, with additional acoustic isolation being provided by the acoustic reflector 16. This minimizes acoustic energy loss from the resonator 14 to the substrate 12 and helps to maintain a high quality factor, Q, for the MEM resonator 10.

Due to the orientation of the acoustic reflector 16 in FIGS. 1A and 1B, the acoustic isolation provided by the acoustic reflector 16 is greatest in a direction along the width of the acoustic resonator 14, with some acoustic coupling to the substrate 12 occurring in a direction along the length of the acoustic resonator 14. This can be advantageous in rejecting spurious acoustic modes in the resonator 14, including length-extensional contour modes, so that oscillation in the acoustic resonator 14 preferentially occurs in a fundamental width-extensional contour mode, or a harmonic thereof.

The acoustic reflector 16 in the example of FIGS. 1A and 1B and the other examples described hereinafter is formed as a cantilevered plate which extends out over the cavity 18 substantially parallel to the substrate 12. The term "cantilevered plate" as used herein is intended to include the situation where one or more sides of the acoustic reflector 16 are attached to the substrate 12, with at least a portion of one side of the acoustic reflector 16 proximate to the acoustic resonator 14 being free-standing. The term "cantilevered plate" as used herein is also intended to include the situation where one or both major surfaces of the acoustic reflector 16 are flat, or corrugated.

The acoustic reflector 16 in FIGS. 1A and 1B comprises a plurality of elongate regions of a first material 24 and a second material 26 in an alternating side-by-side arrangement with the two materials 24 and 26 being different in composition to provide two different alternating acoustic impedances. As an example, the first material 24 can comprise silicon dioxide, aluminum nitride, or silicon with a relatively low acoustic impedance $Z_L$ (e.g. 12 MΩ for silicon dioxide, 26 MΩ for aluminum nitride, and 20 MΩ for silicon); and the second material 26 can comprise tungsten with a relatively high acoustic impedance $Z_H$ of about 89 MegaOhms (MΩ). The acoustic impedance Z for a particular material is defined as the square root of the product of the density and Young's modulus for that material. The term "silicon dioxide" as used herein is intended to include $SiO_2$ and also includes silicate glasses such as TEOS which can be deposited from the decomposition of tetraethylortho silicate. The term "silicon" as used herein with reference to the acoustic reflector 16 and the acoustic resonator 14 is intended to include both monocrystalline silicon and polycrystalline silicon.

In the example of FIGS. 1A and 1B, the width of the two different materials 24 and 26, which are alternated to form the acoustic reflector 16, is substantially equal to one-quarter wavelength, $\lambda/4$, of the resonant acoustic signal within the acoustic resonator 14, or an odd multiple of $\lambda/4$ (i.e. $3\lambda/4$, $5\lambda/4$, . . . ). Those skilled in the art will understand that the actual widths of the materials 24 and 26 needed to provide an acoustic width substantially equal to one-quarter wavelength, $\lambda/4$, of the resonant acoustic signal will be different for the two materials 24 and 26 since these materials are different in composition. The actual width of each elongate region of the materials 24 and 26 will generally be about 10 μm or less.

Each adjacent pair of the elongate regions of materials 24 and 26 acts to reflect a portion of the acoustic energy of the resonant acoustic signal in the acoustic resonator 14 back into the resonator 14, with the amount of reflected acoustic energy Er at each interface between the elongate regions of materials 24 and 26 being proportional to the acoustic impedances $Z_H$ and $Z_L$ of the two different materials 24 and 26 according to:

$$E_r = \left(\frac{Z_H - Z_L}{Z_H + Z_L}\right)^2$$

A plurality of alternating elongate regions of materials 24 and 26 stacked up side-by-side with the materials 24 and 26 being $\lambda/4$ wide or an odd multiple thereof can produce an acoustic reflectivity R given by:

$$R \cong 1 - \left(\frac{Z_L}{Z_H}\right)^N$$

where $Z_L$ and $Z_H$ represent the lower and higher values of the acoustic impedances of the materials 24 and 26, and N is the number of alternating elongate regions of the materials 24 and 26. As an example, when the acoustic reflector 16 comprises alternating elongate regions formed of aluminum nitride ($Z_L$=26 MΩ) and tungsten ($Z_H$=89 MΩ), then three pairs of the alternating elongate regions of aluminum nitride 24 and tungsten 26 can provide a reflectivity R=0.999.

Fabrication of the MEM resonator 10 of FIGS. 1A and 1B will be described hereinafter with reference to FIGS. 2A-2K which show a series of schematic cross-section views taken along the section line 1-1 in FIG. 1A. Fabrication of the MEM resonator 10 utilizes a number of steps for depositing and patterning various materials as will be described in detail hereinafter. Other well-known semiconductor processing steps, including cleaning, masking, photolithography, mask removal, etc., have been omitted since these processing steps are well-known in the art and are not essential to an understanding of the present invention.

Figure 2A:
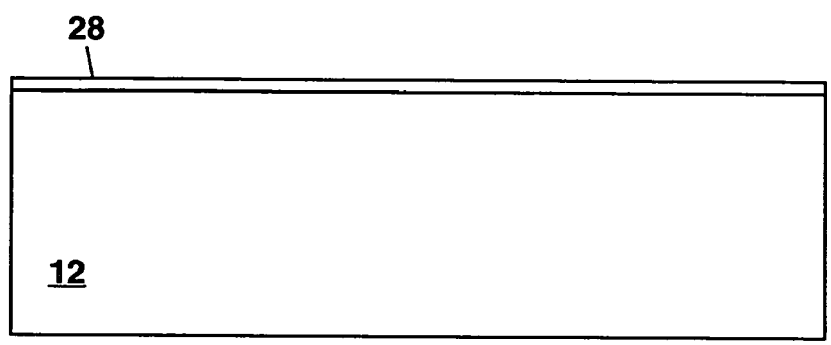
FIGS. 2A-2K show schematic cross-section views along section line 1-1 in FIG. 1A to illustrate fabrication of the MEM resonator of FIGS. 1A and 1B.

In FIG. 2A, a substrate 12 is provided which can comprise monocrystalline silicon. The substrate 12 can include an optional electrically-insulating layer 28 which can be formed over the substrate 12. The electrically-insulating layer 28 can comprise up to several hundred nanometers of a thermal oxide or silicon nitride, or both. The thermal oxide can be formed by a conventional wet oxidation process whereby the silicon substrate material is oxidized to form $SiO_2$ at an elevated temperature (e.g. 1050° C.). The silicon nitride can be a low-stress silicon nitride deposited by low-pressure chemical vapor deposition (LPCVD) at about 850° C.

Figure 2B:
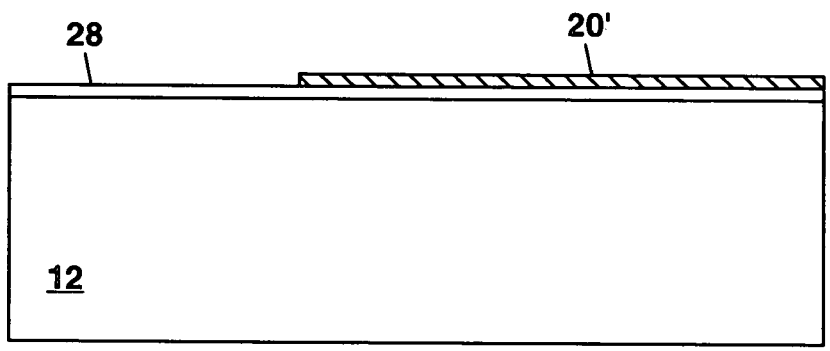

In FIG. 2B, the lower electrode 20' can be formed by blanket depositing a layer of titanium (Ti) about 50 nanometers thick over the substrate 12, followed by blanket deposition of a titanium nitride (TiN) layer about 20 nanometers thick, and an aluminum (Al) layer about 50 nanometers thick. Each of these layers forming the lower electrode 20' can be sputter-deposited. After deposition of the Ti, TiN and Al layers, a reactive ion etching step can be performed to pattern the lower electrode 20' which can completely underlie the acoustic reflector 16 to form a ground plane thereabeneath. The term "aluminum" as used herein is also intended to include aluminum alloys (e.g. including about 1% copper) which are commonly used as an electrical interconnect metallization for semiconductor integrated circuits.

Figure 2C:
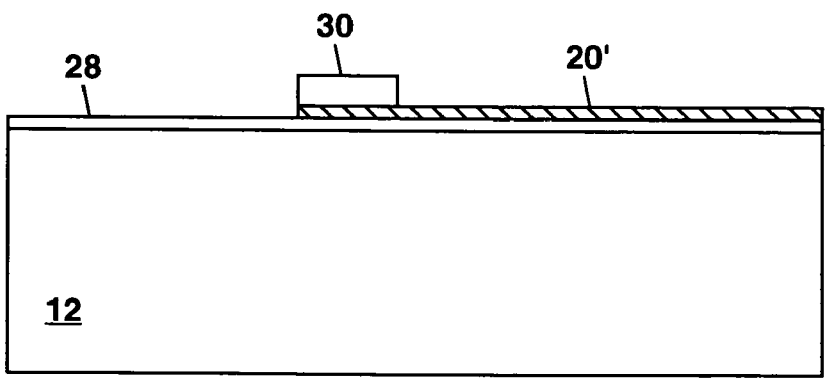

In FIG. 2C a piezoelectric layer 30 comprising aluminum nitride or another piezoelectric material such as ZnO or PZT can be blanket deposited over the substrate 12 with a layer thickness of, for example, 0.75-1 μm. The aluminum nitride can be sputter-deposited at a temperature of about 350° C. Methods for depositing ZnO and PZT, which can include sputter deposition, are well-known in the art. After deposition, the piezoelectric layer 30 can be patterned by reactive ion etching to provide an elongate shape for the acoustic resonator 14 as shown in FIG. 1A.

Figure 2D:
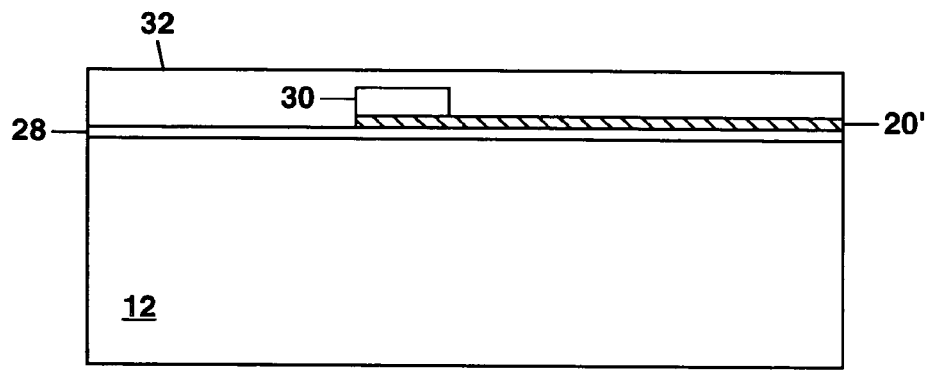

In FIG. 2D, one or more layers of silicon dioxide 32 can be blanket deposited over the substrate 12 to an overall thickness after planarization which can be, for example, 1-4 μm. The silicon dioxide 32 will be used to form the relatively low acoustic impedance $Z_L$ material 24 for the acoustic reflector 16, and as to support one end of the upper electrode 20 above the substrate 12. The silicon dioxide can be deposited as TEOS by plasma-enhanced chemical vapor deposition (PECVD) at a temperature of about 300° C. After the silicon dioxide 32 has been deposited, it can be planarized by a chemical-mechanical polishing (CMP) step. Chemical-mechanical polishing is well-known in the art for planarizing layers during the fabrication of microelectromechanical devices (see e.g. U.S. Pat. No. 5,804,084 which is incorporated herein by reference).

Figure 2E:
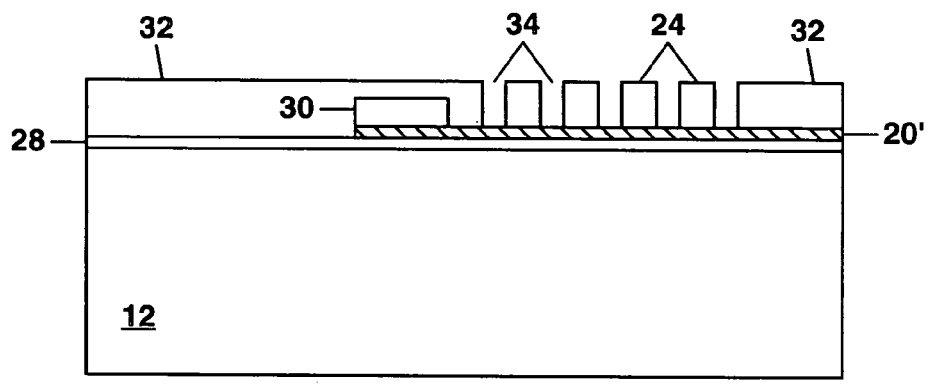

In FIG. 2E, a plurality of elongate openings 34 (i.e. trenches) can be formed down to the underlying lower electrode 20' at locations where tungsten will be deposited to form the relatively high acoustic impedance $Z_H$ material 26 for the acoustic reflector 16. Etching of the elongate openings 34 in the silicon dioxide 32 using a reactive ion etching step also defines the shapes of the relatively low acoustic impedance $Z_L$ material 24 which comprises elongate portions of the silicon dioxide 32. The widths of the elongate openings 34 can be, for example, 2 μm; and the widths of the silicon dioxide between the openings 34 can be, for example, 2.5 μm.

Figure 2F:
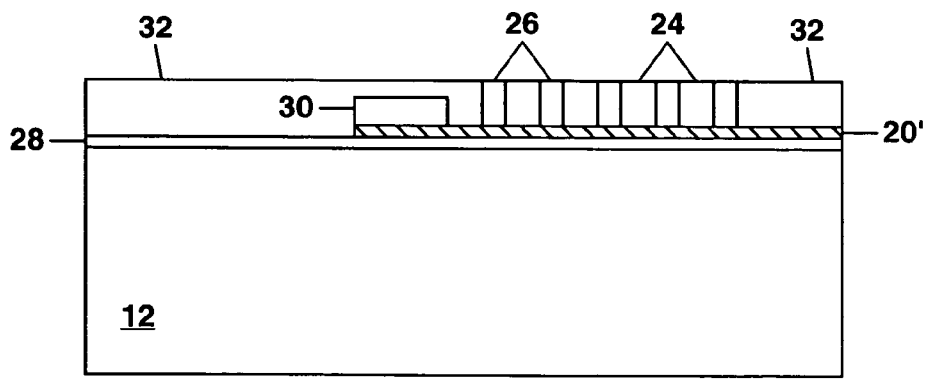

In FIG. 2F, the elongate openings 34 can be filled in with deposited tungsten to form the regions of relatively high acoustic impedance $Z_H$ material 26. In preparation for depositing the tungsten, a 20-50 nanometer thick layer of titanium nitride (not shown) can be initially sputter-deposited over the substrate 12 and in the openings 34. The titanium nitride layer serves as an adhesion layer since tungsten does not stick or nucleate well on the silicon dioxide 32. The titanium nitride layer also helps to compensate for stress in the tungsten since the titanium nitride layer is compressively stressed while the tungsten is tensile stressed. The tungsten can then be blanket deposited over the substrate 12 by chemical vapor deposition (CVD) at a temperature of about 400° C. to fill in the openings and blanket the silicon dioxide 32. A CMP planarizing step can then be used to remove the titanium nitride layer and tungsten overlying the silicon dioxide 32 and to leave the titanium nitride layer and tungsten only in the openings 34.

In FIG. 2F, the tungsten material 26 can be deposited contacting the lower electrode 20' so that the tungsten material 26 can be electrically grounded with the lower electrode 20'. In other embodiments of the present invention, the tungsten material 26 can be electrically isolated from the lower electrode 20'. This can be done by not completely etching through the silicon dioxide 32 when forming the elongate openings 34.

Figure 2G:
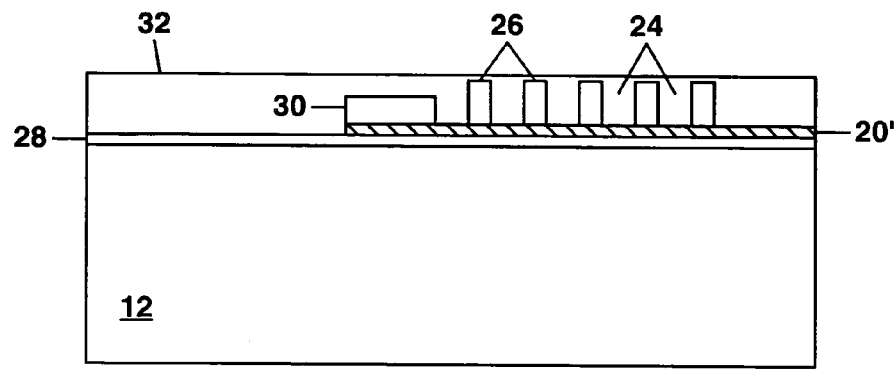

In FIG. 2G, additional silicon dioxide 32 can be blanket deposited over the substrate 12 (e.g. as PECVD TEOS about 200 nanometers thick) to cover the tungsten material 26. This will electrically insulate the tungsten material 26 from a subsequently-deposited upper electrode 20.

Figure 2H:
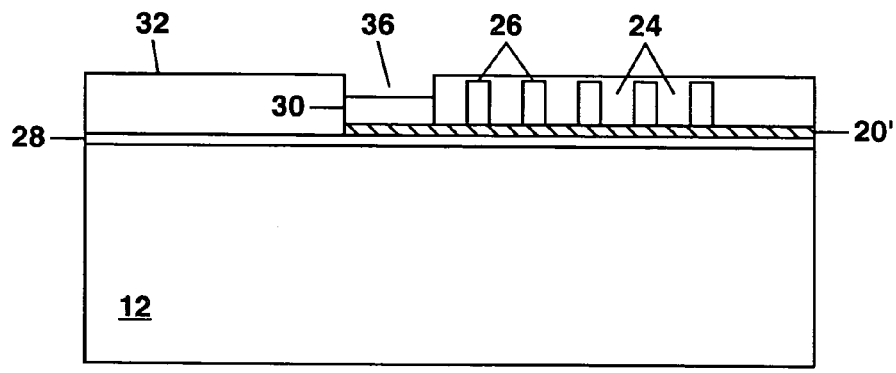

In FIG. 2H, another elongate opening 36 can be etched down through the silicon dioxide 32 to expose the aluminum nitride piezoelectric layer 30. During this step or during the step described hereinafter with reference to FIG. 2J, yet another opening 38 (see FIG. 1A) can be etched partway or entirely through the silicon dioxide 32 to expose an end of the lower electrode 20' away from the acoustic resonator 14 to provide for electrical contacting thereof. When integrated electronic circuitry (e.g. CMOS circuitry) is formed on the substrate 12, the electrodes 20 and 20' can be connected directly to the integrated electronic circuitry, and can even comprise the same interconnect metallization used for the integrated electronic circuitry.

Figure 2I:
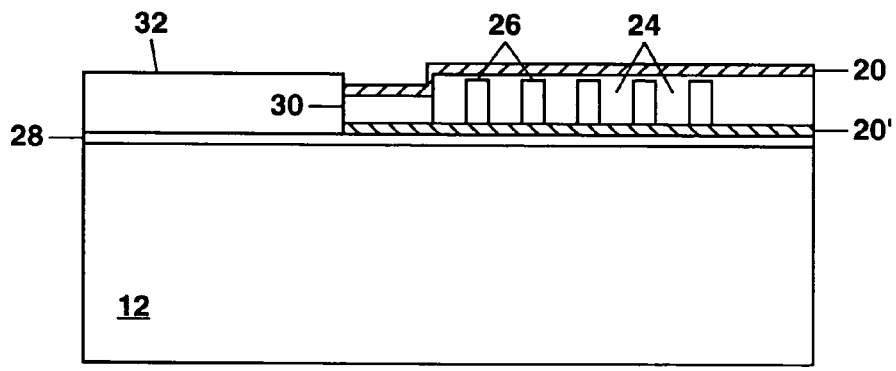

In FIG. 2I, the upper electrode 20 can be deposited and patterned by reactive ion etching, or by lift-off. The upper electrode 20 can comprise, for example, about 100 nanometers of aluminum which can be sputter-deposited.

Figure 2J:
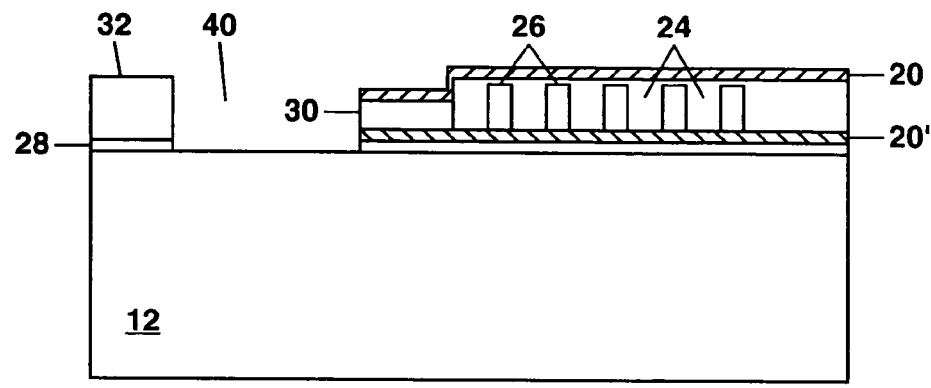

In FIG. 2J, an opening 40 can be etched (e.g. with reactive ion etching) down through the silicon dioxide 32 and the underlying electrically-insulating layer 28 to expose the substrate 12.

Figure 2K:
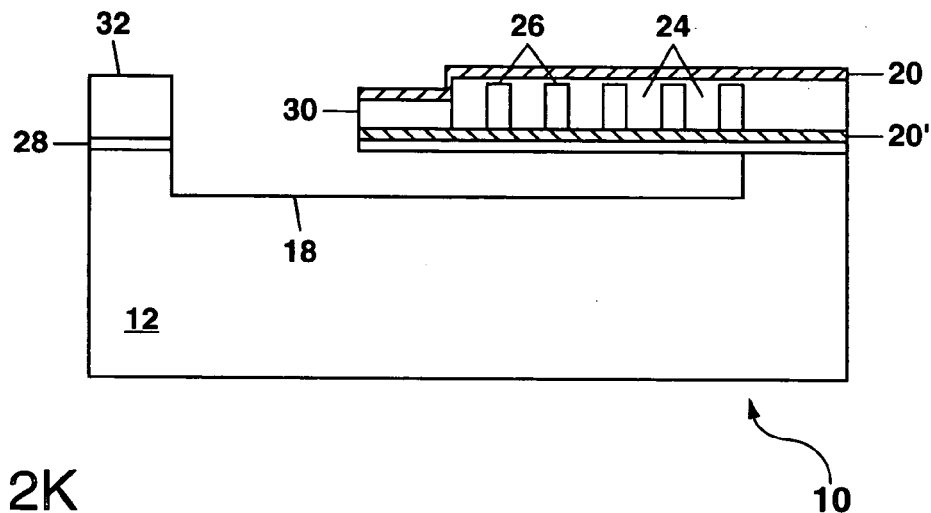

In FIG. 2K, fabrication of the MEM resonator 10 of FIGS. 1A and 1B can be completed by etching the cavity 18 beneath the acoustic resonator 14 and the acoustic reflector 16. The cavity 18 can be isotropically etched into the silicon substrate 12 through the opening 40. This can be done using a dry $SF_6$ plasma without any applied bias. The $SF_6$ plasma also undercuts the silicon beneath the acoustic resonator 14 and extends partially or completely beneath the acoustic reflector 16.

The $SF_6$ plasma isotropically etches the silicon while not substantially etching other exposed elements of the MEM resonator 10 not made of silicon. Although tungsten can be attacked by the $SF_6$ plasma, the tungsten material 26 in the acoustic reflector 16 is protected from exposure to the $SF_6$ plasma by being encapsulated above by silicon dioxide and below by the lower electrode 20' and the electrically-insulating layer 28. In embodiments of the present invention wherein the electrically-insulating layer 28 is omitted, the lower electrode 20' comprising aluminum, which can extend beneath the entire extent of the acoustic reflector 16, can protect the tungsten material 26 from being etched by the $SF_6$ plasma.

In the example of FIGS. 1A and 1B, the acoustic reflector 16 can be made thicker than the acoustic resonator 14. This can be advantageous to suppress the transmission of the resonant acoustic signal through the upper electrode 20. In other embodiments of the present invention, the thickness of the acoustic resonator 14 and the acoustic reflector 16 can be substantially the same.

Figure 3A:
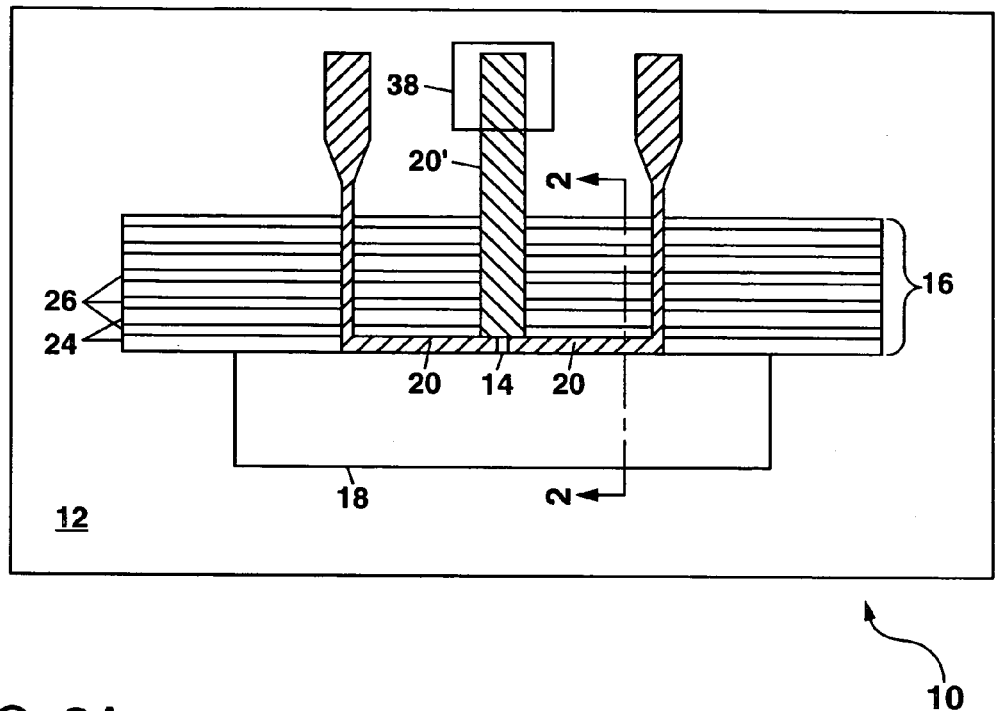
FIGS. 3A and 3B show schematic plan and cross-section views, respectively, of a second example of the MEM resonator of the present invention.
Figure 3B:
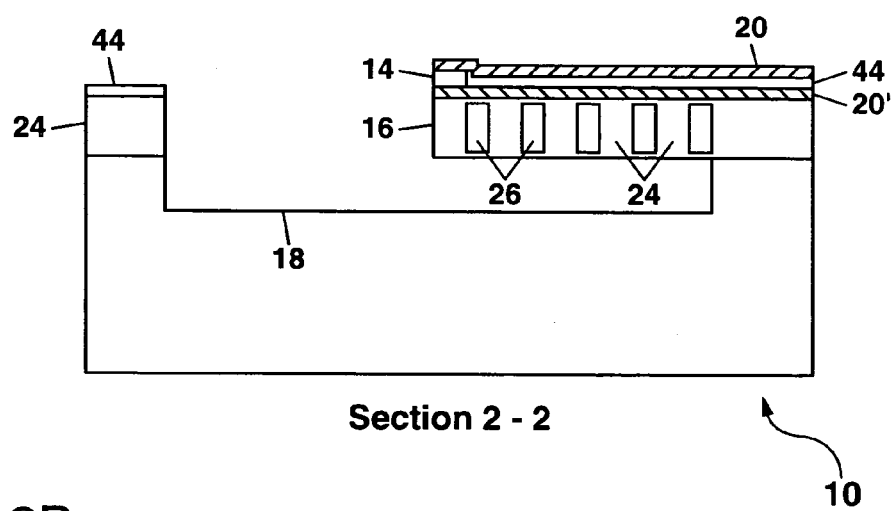

Schematic plan and cross-section views, respectively, are shown in FIGS. 3A and 3B for a second example of the MEM resonator 10 of the present invention. In this example of the present invention, the acoustic resonator 14 is suspended over the substrate 12 on top of a free-standing side of the acoustic reflector 16. Additionally, the MEM resonator 10 of FIGS. 3A and 3B includes a pair of upper electrodes 20 with one of the upper electrodes 20 being used as a drive electrode to drive the acoustic resonator 14 to oscillate in a width-extensional contour mode, and with the other upper electrode 20 being used as a sense electrode to sense the resonant acoustical signal corresponding to oscillation in the width-extensional contour mode and to produce therefrom an oscillatory electrical output signal at the frequency of oscillation.

Location of the acoustic resonator 14 atop the free-standing side of the acoustic reflector 16 can simplify fabrication of this second example of the MEM resonator 10 as will be described hereinafter with reference to FIGS. 4A-4K. Additionally, this second example of the present invention can allow a greater latitude in terms of deposition temperatures for fabrication of the acoustic reflector 16, especially when the MEM resonator 10 is fabricated on a substrate 12 without any integrated electronic circuitry, since fabrication of the acoustic reflector 16 can be completed prior to formation of the acoustic resonator 14.

Figure 4A:
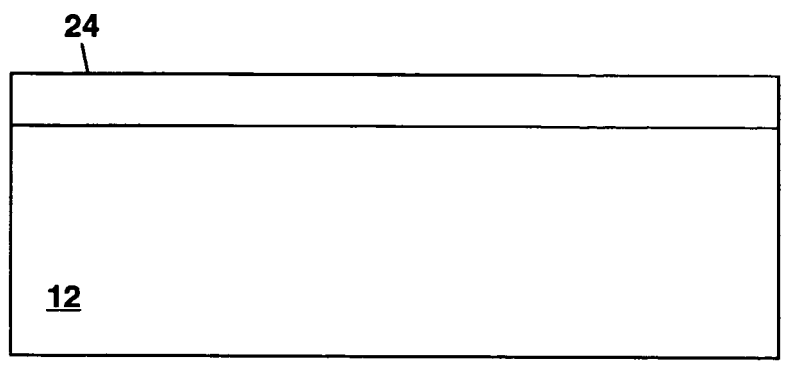
FIGS. 4A-4K show schematic cross-section views along section line 2-2 in FIG. 3A to illustrate fabrication of the MEM resonator of FIGS. 3A and 3B.

In FIG. 4A, a substrate 12 is provided which generally comprises silicon, although those skilled in the art will understand that the MEM resonator can be formed on many other types of substrates including semiconductor, glass, quartz, fused silica and ceramic substrates. One or more layers of a relatively low acoustic impedance $Z_L$ material 24 such as silicon dioxide or silicon nitride can be blanket deposited over the substrate 12 to an overall thickness which can be up to several microns (e.g. 1-5 μm). The silicon dioxide material 24 can be deposited as a thermal oxide and/or by PECVD as described previously with reference to FIGS. 2A and 2D. Alternately, the silicon dioxide material 24 can be deposited, at least in part, using low-pressure chemical vapor deposition (LPCVD) which can occur at a temperature of about 750° C. for TEOS. When the material 24 comprises silicon nitride, the silicon nitride can be deposited by PECVD at a relatively low temperature of 400° C. or less, or alternately by LPCVD at temperature of about 850° C.

Silicon (either polycrystalline silicon or monocrystalline silicon) can also be used as the relatively low acoustic impedance $Z_L$ material 24. When polycrystalline silicon is used, the polycrystalline silicon will generally be deposited over a layer of a thermal oxide or silicon nitride or both as previously described with reference to FIG. 2A to protect the polycrystalline silicon material 24 from being etched when the substrate 12 is later etched to form the cavity 18. The polycrystalline silicon can be deposited, for example, at a temperature of 580° C. by LPCVD and can be doped for electrical conductivity (e.g. when the polycrystalline silicon material 24 forms the lower electrode 20'). When monocrystalline silicon is used for the relatively low acoustic impedance $Z_L$ material 24, a silicon-on-insulator (SOI) substrate 12 can be provided which comprises a layer of silicon dioxide on a monocrystalline silicon body with a layer of monocrystalline silicon above the layer of silicon dioxide. Fabrication of the MEM resonator 10 using an SOI substrate 12 will be described in detail hereinafter with reference to FIGS. 8A-8L.

Figure 4B:
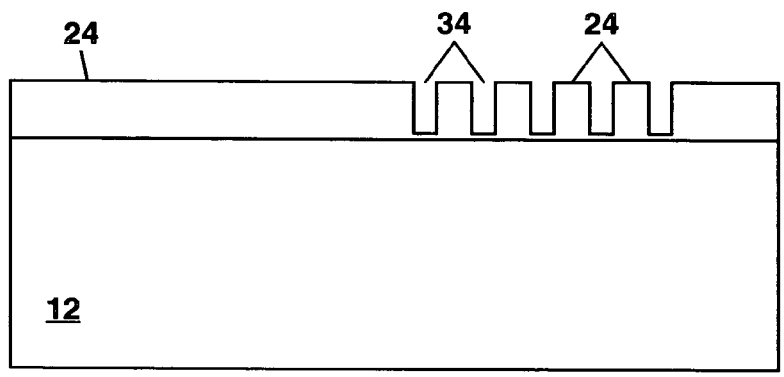

In FIG. 4B, the relatively low acoustic impedance $Z_L$ material 24 can be photolithographically patterned and etched to form a plurality of elongate openings 34 (i.e trenches) down through a majority of the thickness of the material 24 without exposing the substrate 12.

Figure 4C:
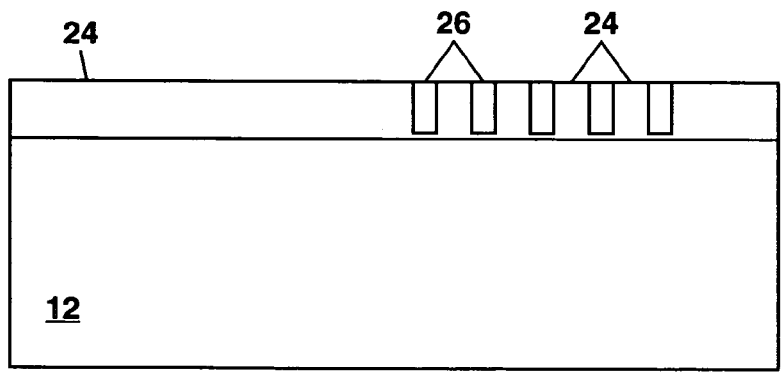

In FIG. 4C, the elongate openings 34 can be filled in with a relatively high acoustic impedance $Z_H$ material 26 which can comprise tungsten. The tungsten can be deposited as previously described with reference to FIG. 2F. After deposition of the tungsten, a CMP planarizing step can be used to remove any of the tungsten (and titanium nitride) which are deposited outside of the openings 34.

Figure 4D:
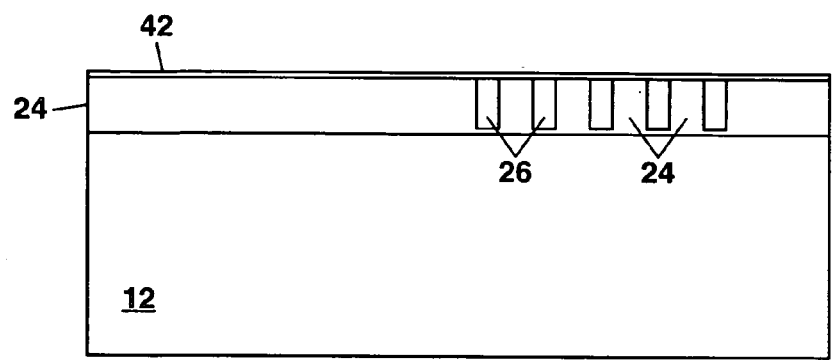

In FIG. 4D, a thin layer 42 of silicon dioxide or silicon nitride about 200 nanometers thick can be blanket deposited over the substrate 12 by PECVD. The layer 42 is useful to electrically isolate the tungsten material 26 in the acoustic reflector 16 from an overlying lower electrode 20'. The layer 42 will be shown hereinafter merged into the underlying relatively low acoustic impedance $Z_L$ material 24.

Figure 4E:
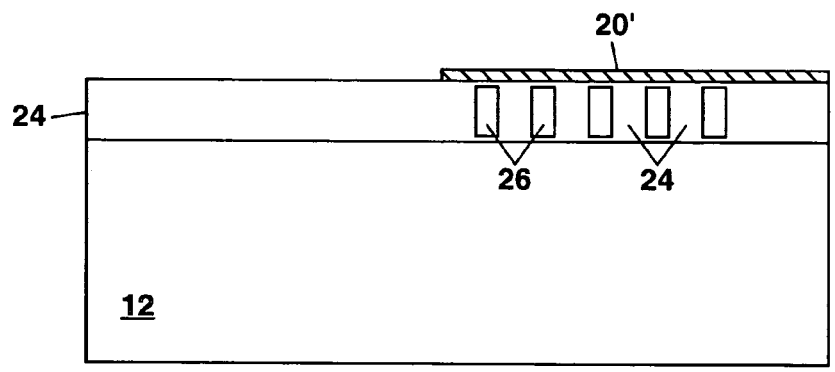

In FIG. 4E, the lower electrode 20' can be blanket deposited over the substrate 12 and patterned by reactive ion etching as previously described with reference to FIG. 2B. The lower electrode 20' can comprise a sandwich of about 50 nanometers Ti covered by about 20 nanometers of TiN and about 50 nanometers of Al, or alternately about 100 nanometers of Al. The lower electrode 20' can partially or completely overlie the acoustic reflector 16, and extends beneath the acoustic resonator 14 to provide a lower contact thereto.

Figure 4F:
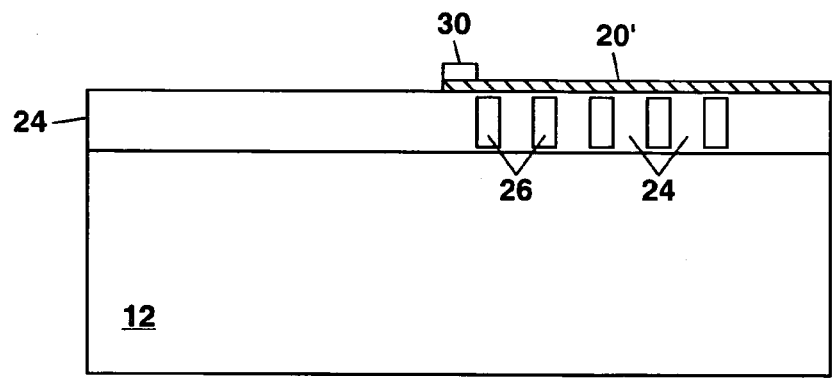

In FIG. 4F, the piezoelectric layer 30 (e.g. AlN, ZnO or PZT) can be blanket deposited over the substrate 12 and patterned by reactive ion etching. As an example, the piezoelectric layer 30 can comprise aluminum nitride with a layer thickness of about 250 nanometers. In this example of the present invention, the piezoelectric layer 30 can be stimulated to oscillate in a width-extensional contour mode; and the oscillation of the piezoelectric layer 30 can further stimulate a portion of the acoustic reflector 16 beneath the piezoelectric layer 30 to oscillate in the same width-extensional contour mode.

Figure 4G:
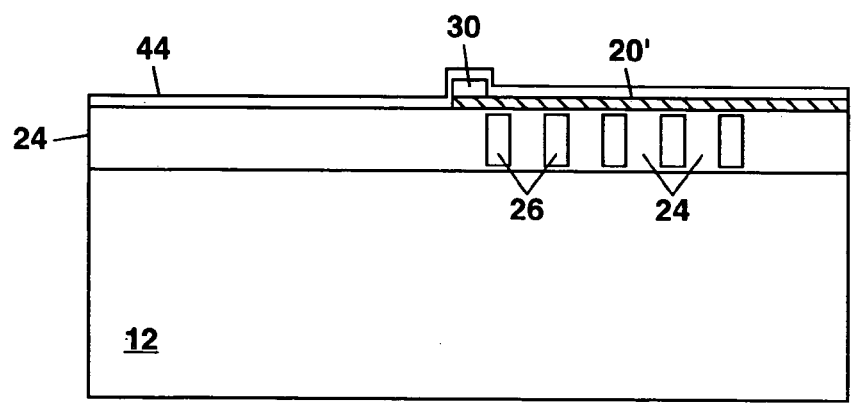

In FIG. 4G, an isolation layer 44 can be blanket deposited over the substrate 12. The isolation layer 44, which electrically isolates the lower electrode 20' from the upper electrodes 20 to be subsequently formed, can comprise silicon dioxide deposited by PECVD (e.g. as TEOS) with a layer thickness of, for example, 300 nanometers.

Figure 4H:
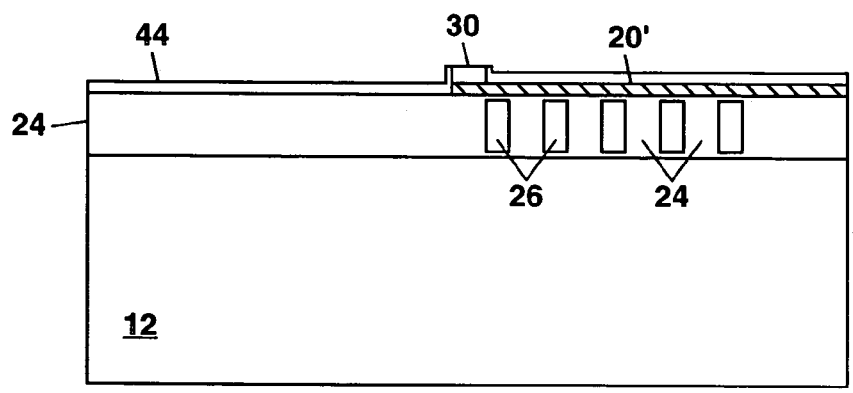

In FIG. 4H, the isolation layer 44 can be removed above the piezoelectric layer 30 in preparation for forming the upper electrodes 20 to the piezoelectric layer 30. Removal of the isolation layer 44 above the piezoelectric layer can be performed using reactive ion etching, which can also be used to form an opening 38 through the isolation layer 44 to expose the lower electrode 20' (see FIG. 3A).

Figure 4I:
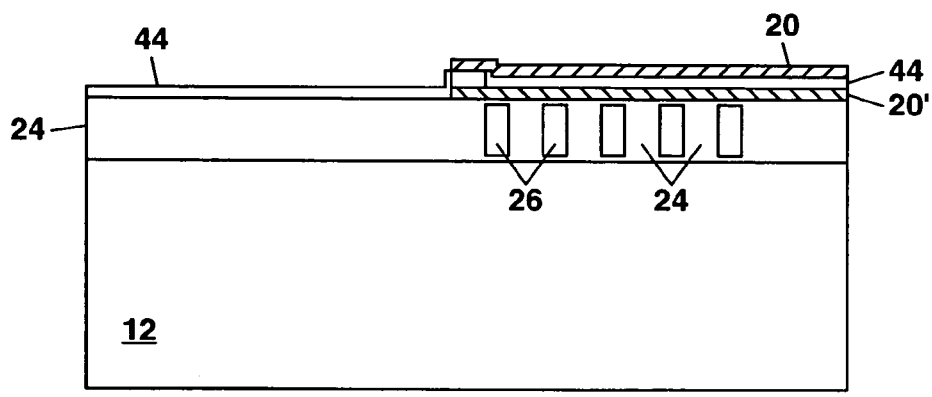

In FIG. 4I, the upper electrodes 20 can be deposited over the substrate 12 by sputtering, and then patterned by reactive ion etching. The upper electrodes 20 can be, for example, 200 nanometers thick and can be formed from aluminum.

Figure 4J:
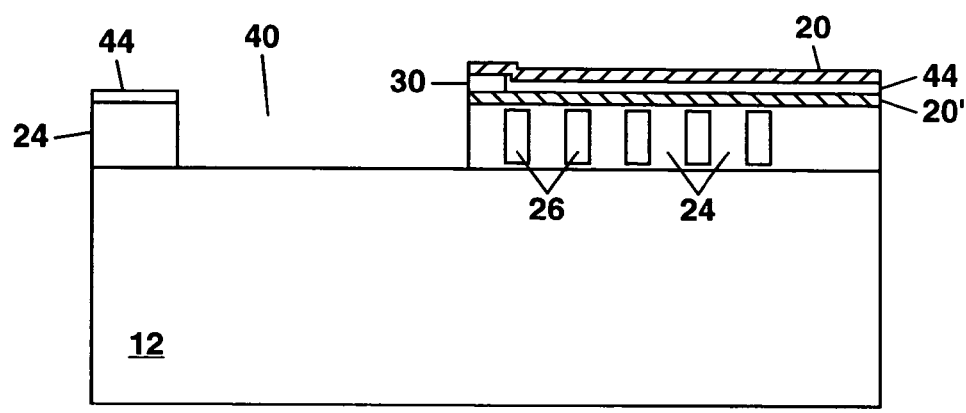
Figure 4K:
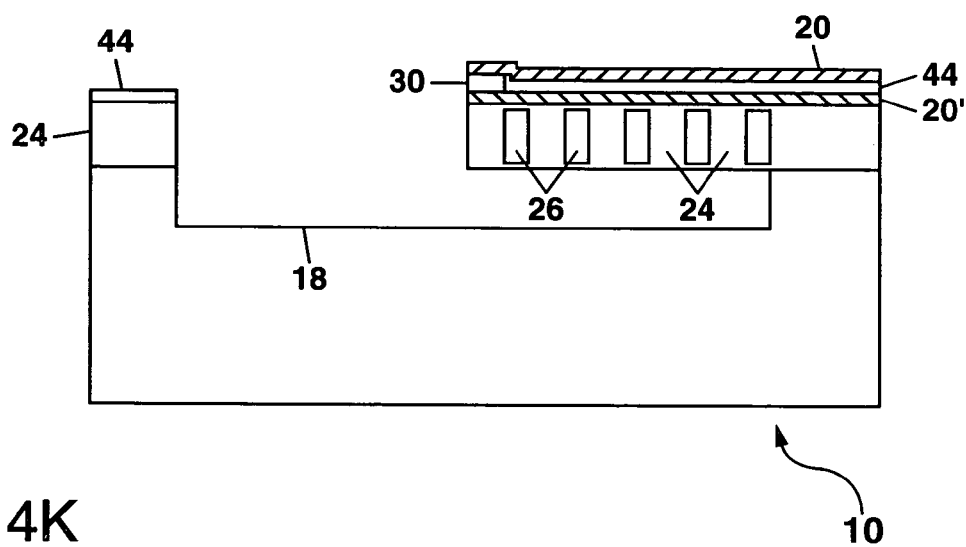

In FIG. 4J, an opening 40 can be etched (e.g. with reactive ion etching) to expose the substrate 12. The cavity 18 can then be isotropically etched as described previously with reference to FIG. 2K to complete fabrication of this example of the MEM resonator 10.

Figure 5A:
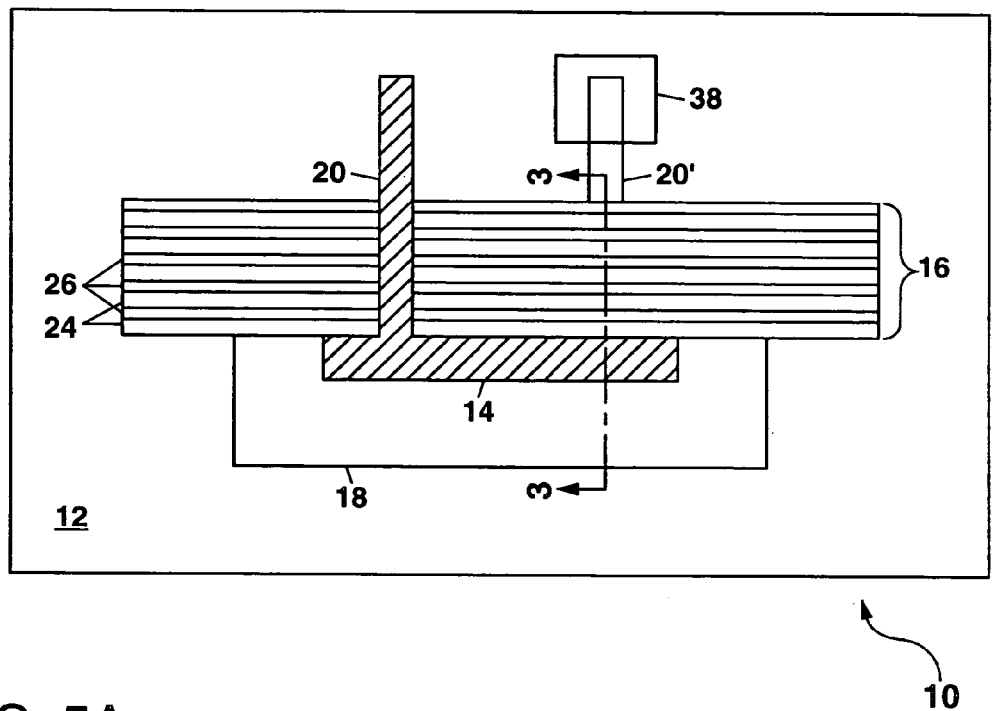
FIGS. 5A and 5B show schematic plan and cross-section views, respectively, of a third example of the MEM resonator of the present invention.
Figure 5B:
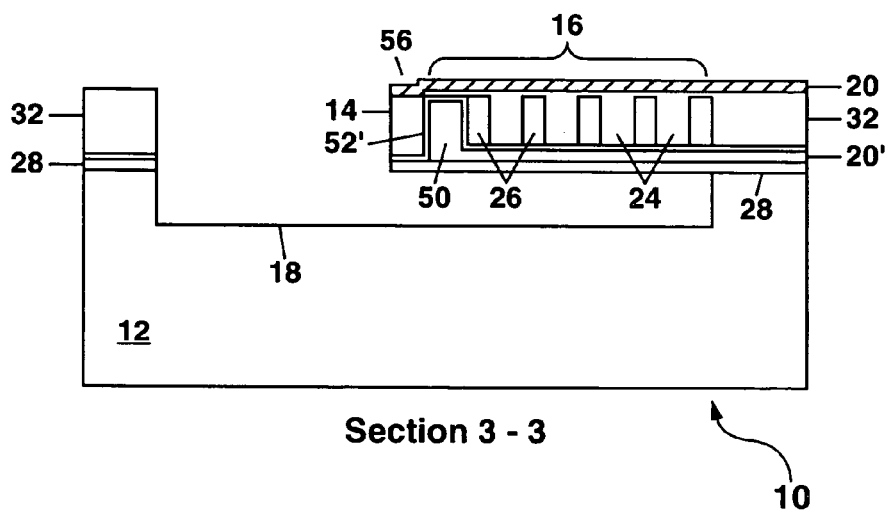

FIGS. 5A and 5B show a schematic plan view and a schematic cross-section view, respectively, of a third example of the MEM resonator 10 of the present invention. In this third example, the MEM resonator 10 is electrostatically activated (also termed capacitively transduced or electrostatically induced) so that no piezoelectric material is needed for the acoustic resonator 14. Instead, the acoustic resonator 14 can be formed from other types of materials, for example, monocrystalline or polycrystalline silicon. The term "electrostatically activated" as used herein refers to a dilation or contraction produced by an electric field between a pair of capacitor plates separated by a dielectric material in response to a changing voltage V provided across the pair of capacitor plates.

FIGS. 6A-6M show a series of cross-section views taken along the section line 3-3 in FIG. 5A to illustrate fabrication of the MEM resonator 10 using polycrystalline silicon (also termed polysilicon) for the acoustic resonator 14.

Figure 6A:
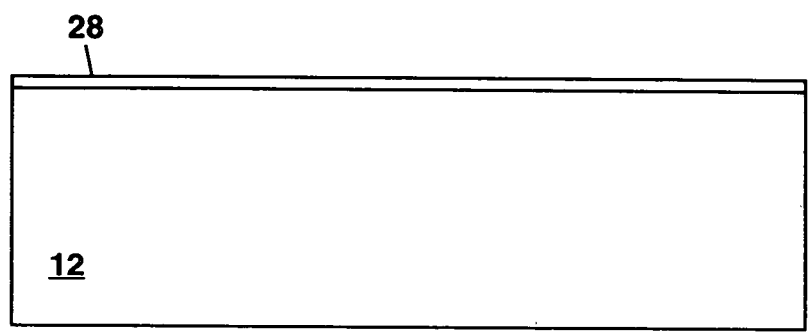
FIGS. 6A-6L show schematic cross-section views along section line 3-3 in FIG. 5A to illustrate fabrication of the MEM resonator of FIGS. 5A and 5B.

In FIG. 6A, an electrically-insulating layer 28 can be formed over a silicon substrate 12 as previously described with reference to FIG. 2A.

Figure 6B:
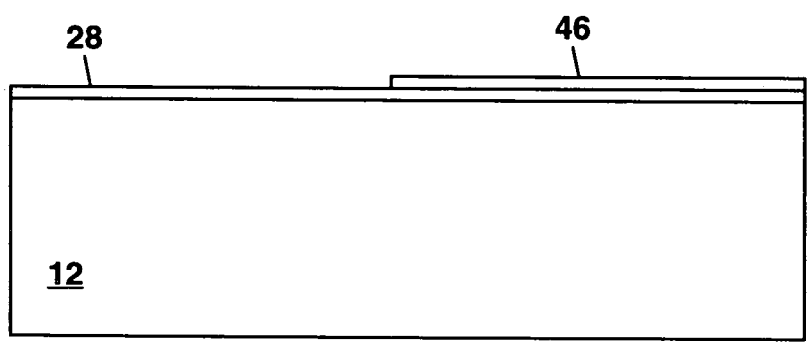

In FIG. 6B, a first layer 46 of polysilicon can be blanket deposited over the substrate 12 by LPCVD at a temperature of about 580° C., or alternately by PECVD. The first polysilicon layer 46 can then be patterned by reactive ion etching to form a shape corresponding to that of the lower electrode 20'. The first polysilicon layer 46 can be about 0.3 μm thick, and can be doped for electrical conductivity (e.g. n-type doped with phosphorous, or p-type doped with boron). The first polysilicon layer 46 and other polysilicon layers described hereinafter can be annealed after deposition to reduce any stress therein, and also to increase the electrical conductivity therein.

Figure 6C:
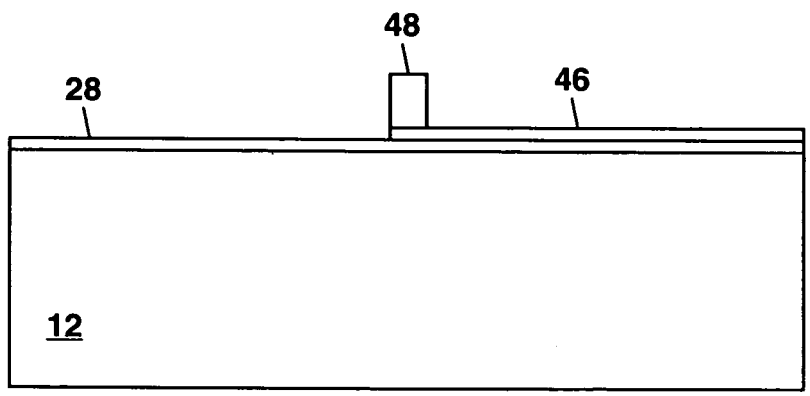

In FIG. 6C, a second layer 48 of polysilicon can be blanket deposited over the substrate 12 by LPCVD, and patterned by reactive ion etching. The second polysilicon layer 48 can be up to several microns thick and is also doped for electrical conductivity. The first and second polysilicon layers 46 and 48 together form a first electrode 50 for the MEM resonator 10. Additionally, the second polysilicon layer 48 can form a relatively low acoustic impedance $Z_L$ material within the acoustic reflector 16. In other embodiments of the present invention, the relatively high acoustic impedance $Z_H$ material 26 comprising tungsten can be substituted for the second polycrystalline layer 48 in forming the first electrode 50. In this case, the ordering of the materials 24 and 26 in the acoustic reflector 16 can be reversed from that shown in FIGS. 5A and 5B.

Figure 6D:
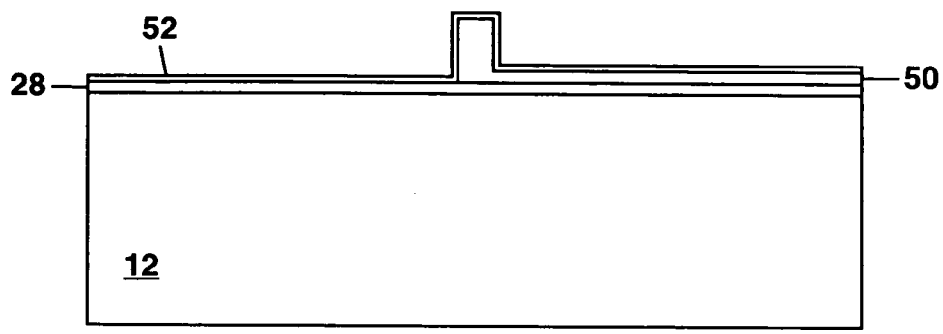

In FIG. 6D, a thin dielectric layer 52 of an electrically-insulating material such as silicon dioxide, silicon nitride or titanium dioxide can be blanket deposited over the substrate 12 by PECVD, LPCVD or sputtering. A titanium dioxide layer 52 can be formed by depositing a titanium nitride layer which is then oxidized at 500° C. for 60 seconds in a rapid thermal annealer. The dielectric layer 52 can be, for example, 20-50 nanometers thick.

Figure 6E:
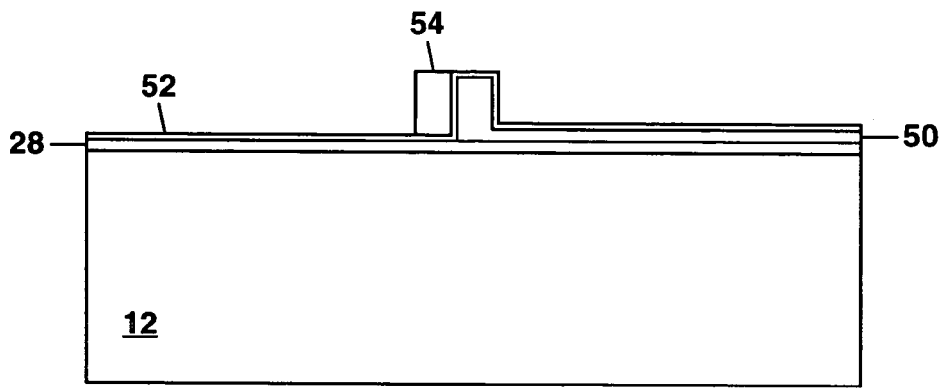

In FIG. 6E, a third layer 54 of polysilicon can be blanket deposited over the substrate 12 and planarized by CMP down to or below an uppermost portion of the dielectric layer 52. The third polysilicon layer 54 can also be doped with phosphorous or boron for electrical conductivity. The third polysilicon layer 54 can then be patterned by reactive ion etching to form the acoustic resonator 14 and a second electrode 56 therein (see FIG. 6F). The acoustic resonator 14 in this third example of the present invention can have a width (e.g. 1-10 μm) that is selected to facilitate oscillation in a particular width-extensional contour mode (e.g. a fundamental mode), and a length which can be, for example, 100-200 μm.

Figure 6F:
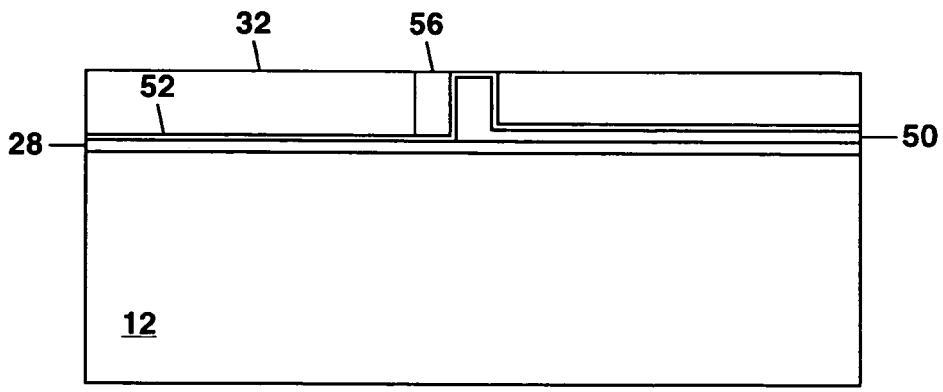
Figure 6G:
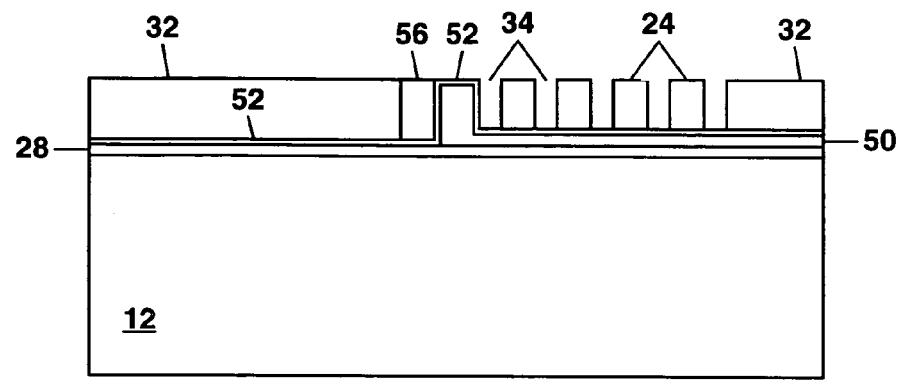

In FIG. 6F, one or more layers of silicon dioxide 32, or alternately silicon nitride or polysilicon, can be blanket deposited over the substrate 12 by either PECVD or LPCVD and then planarized by CMP. A plurality of openings 34, which are shown in FIG. 6G, can be formed in the silicon dioxide 32 as previously described with reference to FIG. 2D. The silicon dioxide 32 left in place between the openings 34 will form the relatively low acoustic impedance $Z_L$ material 24 of the acoustic reflector 16.

Figure 6H:
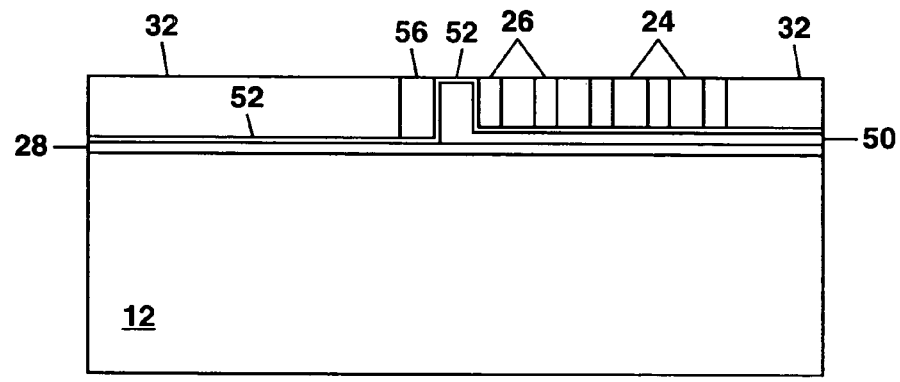

In FIG. 6H, the openings 34 can be filled with tungsten as previously described with reference to FIG. 2F; and then the substrate 12 can be planarized by CMP to remove any of the tungsten outside the openings 34. The deposited tungsten will form the relatively high acoustic impedance $Z_H$ material 26 of the acoustic reflector 16.

Figure 6I:
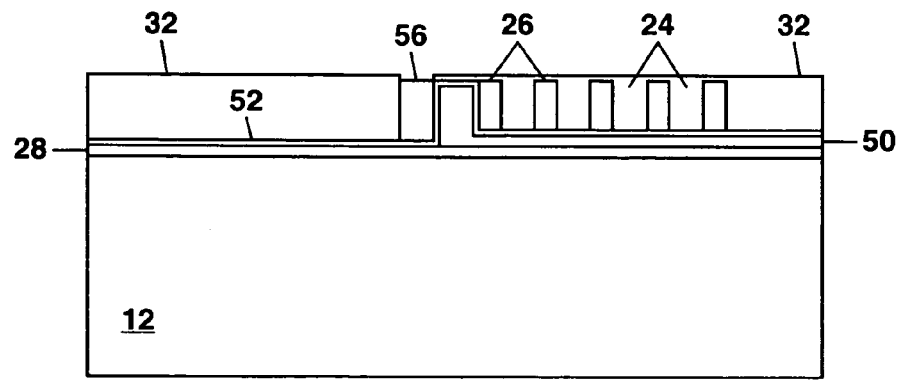

In FIG. 6I, an additional layer of silicon dioxide 32, or alternately silicon nitride, can be blanket deposited over the substrate 12 by PECVD, LPCVD or sputtering, and then can be reactive ion etched to expose the top of the second electrode 56.

Figure 6J:
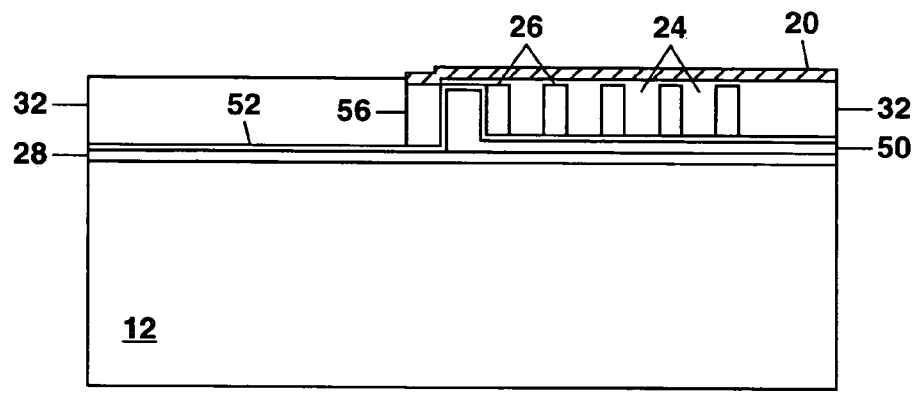

In FIG. 6J, an upper electrode 20, which forms an electrical connection to the second electrode 56 and which can be considered to be a part of the second electrode 56, can be formed by sputter-depositing a layer of aluminum about 200 nanometers thick over the substrate 12, and then patterning the aluminum layer using reactive ion etching or lift-off.

Figure 6K:
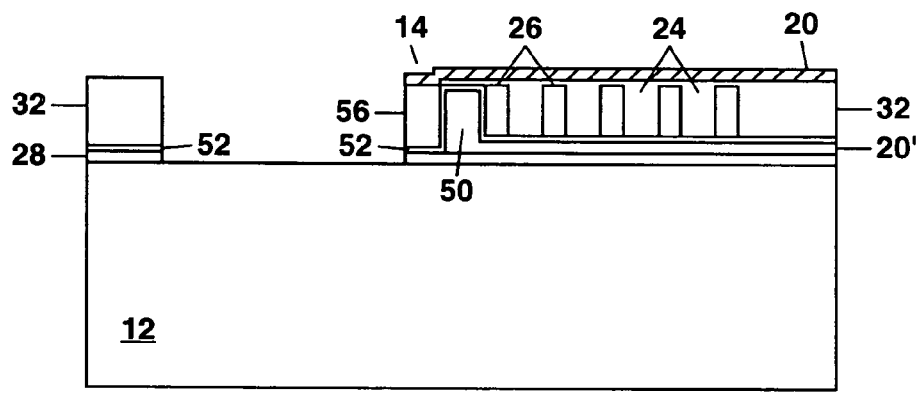

In FIG. 6K, the silicon dioxide 32 and underlying layers 52 and 28 can be etched down to expose the substrate 12 as previously described with reference to FIG. 2J. An opening 38 can also be etched down to expose an end of the lower electrode 20 (see FIG. 5A).

Figure 6L:
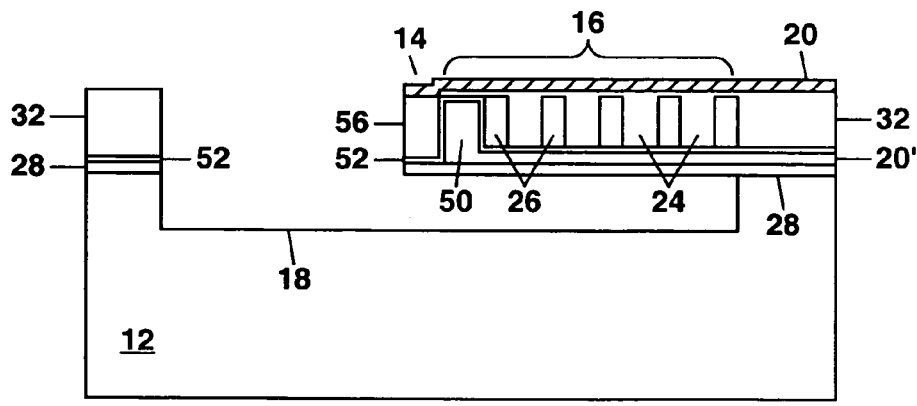

In FIG. 6L, the cavity 18 can then be formed by isotropically etching the substrate 12 to undercut the acoustic reflector 16 as previously described with reference to FIG. 2K. This completes fabrication of this example of the MEM resonator 10.

Returning to FIGS. 5A and 5B, when an oscillatory voltage V is applied across the electrodes 50 and 56, this voltage V appears across a vertical portion 52' of the dielectric layer 52 between the first and second electrodes, 50b and 56, with the electrodes 50 and 56 acting as capacitor plates with the layer 52 being a dielectric therebetween. The voltage V produces an oscillatory electrostatic force which is directed substantially parallel to the substrate 12 and between the first and second electrodes, 50 and 56 and which compresses and expands the width of the vertical portion 52' thereby electrostatically activating the acoustic resonator 14. Movement of the vertical portion 52' also moves the second electrode 56 in the acoustic resonator 14, thereby stimulating the second electrode 56 to oscillate in a width-extensional contour mode. The exact contour mode which oscillates and the frequency of oscillation can be determined from the width of the second electrode 56. Both the vertical portion 52' and the second electrode 56 are considered herein to be electrostatically-activated materials.

Figure 7A:
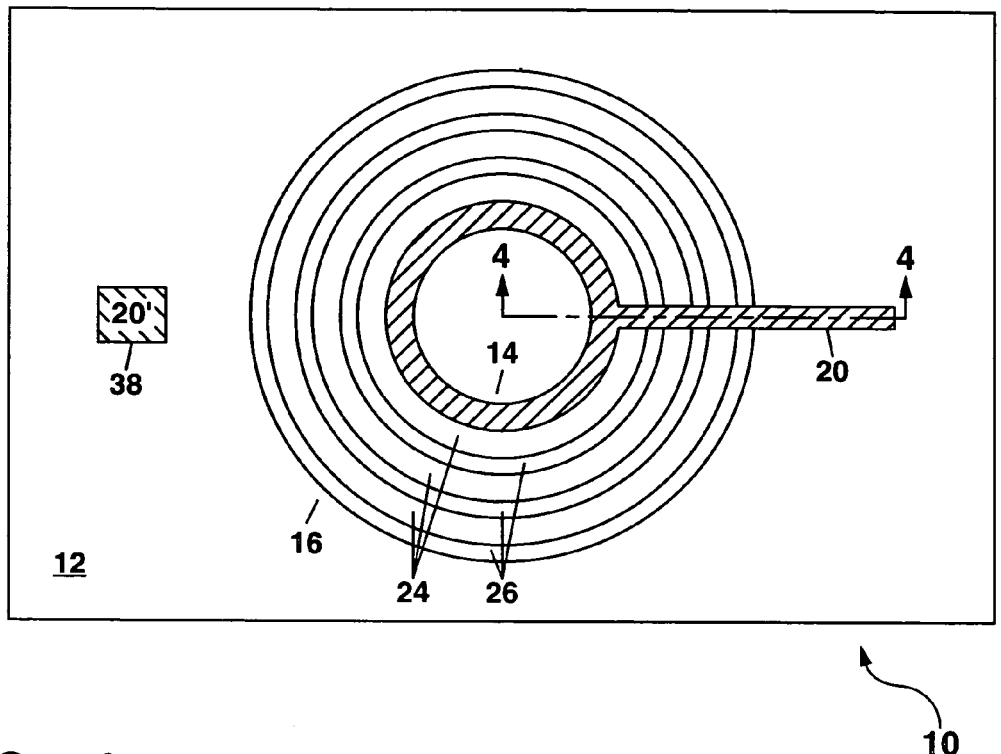
FIGS. 7A and 7B show schematic plan and cross-section views, respectively, of a fourth example of the MEM resonator of the present invention.
Figure 7B:
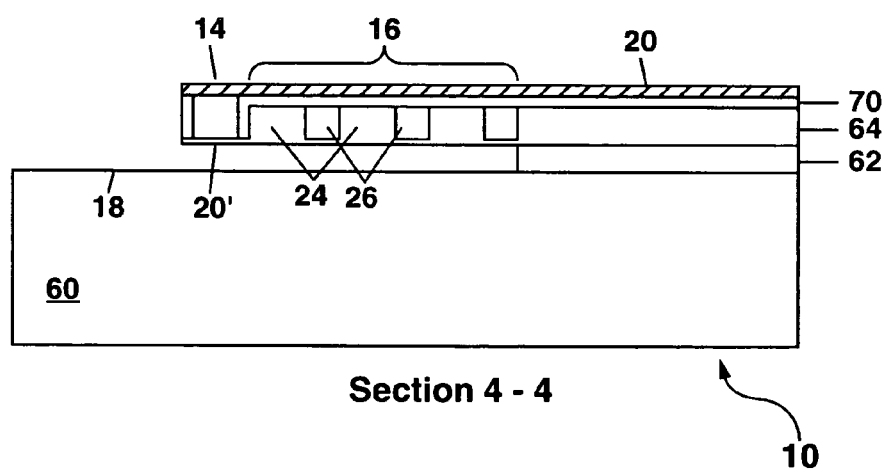

A fourth example of the MEM resonator 10 of the present invention is illustrated in FIGS. 7A and 7B. FIG. 7A shows a plan view of this MEM resonator 10; and FIG. 7B shows a cross-section view along the section line 4-4 in FIG. 7A. The fourth example of the MEM resonator 10 comprises an acoustic resonator 14 having a ring shape (also termed a ring resonator 14), and an acoustic reflector 16 which also has a ring shape. A plurality of nested rings (i.e. rings of different sizes located one inside of another) of the relatively low acoustic impedance $Z_L$ material 24 and relatively high acoustic impedance $Z_H$ material 26 are used for the acoustic reflector 16. Although, the example of FIGS. 7A and 7B shows three nested rings of each material 24 and 26 for the acoustic reflector 16, in other embodiments of the present invention, a larger number (e.g. 5-7) of nested rings of each material 24 and 26 can be used.

The term "ring shape" as used herein refers to a shape which is generally circular with a central portion therein being partially or completely open, but is also intended to refer to a shape which can be elliptical or polygonal with a central portion that is partially or completely open. Additionally, the term "ring shape" as used herein is intended to include any shape which comprises at least a portion of a ring, including a curved segment of a circular or elliptical ring, or a bent segment of a polygonal ring.

The use of a ring-shaped acoustic resonator 14 is advantageous since the motional impedance therein is determined by a radius, r, of the resonator 14 while a resonant frequency therein is determined by a width, w, of the resonator 14. This allows an independent adjustment of the motional impedance and resonant frequency. The radius, r, of the acoustic resonator 14 can be, for example, 50-500 μm; and the width, w, can be, for example, 1-10 μm. The width, w, of the resonator will generally be substantially equal to one-half wavelength (i.e. λ/2) of an acoustic resonance frequency of the MEM resonator 10, or a multiple thereof.

Oscillation of the ring-shaped acoustic resonator 14 occurs only in width-extensional contour modes since the length of the ring-shaped acoustic resonator 14 is essentially infinite (i.e. it has no ends that can be used to set up a length-extensional contour mode). The fundamental width-extensional contour mode has a shape which is defined by radial dilation of the ring-shaped acoustic resonator 14, with an inner radius of the resonator 14 generally changing in size while an outer radius of the resonator 14 is pinned by the surrounding acoustic reflector 16.

The acoustic reflector 16 in FIGS. 7A and 7B comprises a series of nested rings formed alternately from a relatively low acoustic impedance $Z_L$ material 24 and a relatively high acoustic impedance $Z_H$ material 26. Each nested ring is elongate with no end which can leak acoustic energy as contrasted to the acoustic reflectors in the examples of FIGS. 1, 3 and 5 which allow some acoustic energy leakage from the ends of the acoustic reflector 16. Thus, the ring-shaped acoustic reflector 16 in FIGS. 7A and 7B is expected to provide a higher degree of acoustic isolation than the linear acoustic reflectors 16 in FIGS. 1, 3 and 5.

The ring-shaped acoustic reflector 16 in FIGS. 7A and 7B can also provide for efficient heat conduction to improve the power handling capability of this MEM resonator 10. Due to radial symmetry in this device 10, heat generated within the acoustic resonator 14 is conducted radially outward to the substrate 12 through an increasing volume of material 24 and 26 in the acoustic reflector 16, thereby providing an efficient heat-sinking geometry for this example of the MEM resonator 10.

Fabrication of the MEM resonator 10 of FIGS. 7A and 7B will now be described with reference to FIGS. 8A-8L which show schematic cross section views along the section line 4-4 in FIG. 7A. Although the fourth example of the present invention will be described with reference to fabrication using a silicon-on-insulator (SOI) substrate 12, those skilled in the art will understand that ring-shaped MEM resonators 10 according to the present invention can be formed by any of the processes described heretofore with reference to FIGS. 2A-2K, 4A-4K, and 6A-6L. Those skilled in the art will also understand that the other examples of the MEM resonator 10 of the present invention can also be fabricated by the process described hereinafter with reference to FIGS. 8A-8L. Additionally, the process described hereinafter will utilize a silicon dioxide layer 62 of the SOI substrate 12 as an etch release layer which will be partially removed to form the cavity 18 below the acoustic resonator 14 and the acoustic reflector 16. In other embodiments of the present invention, a monocrystalline silicon layer 64 of the SOI substrate 12 can be used as the etch release layer. These embodiments of the present invention can be formed in a manner similar to that described previously with reference to FIGS. 2A-2K, 4A-4K, and 6A-6L except that fabrication is performed using an SOI substrate 12 with the monocyrstalline silicon layer 64 being partially etched away to form the cavity 18 instead of etching a bulk silicon substrate 12.

Figure 8A:
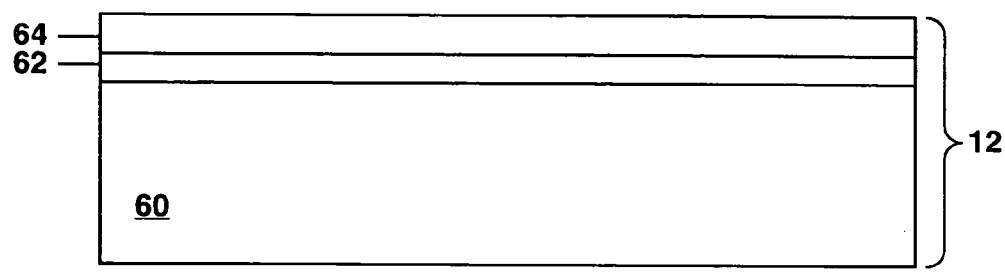
FIGS. 8A-8L show schematic cross-section views along section line 4-4 in FIG. 7A to illustrate fabrication of the MEM resonator of FIGS. 7A and 7B.

In FIG. 8A, an SOI substrate 12 is provided. The SOI substrate 12, which is available commercially, comprises a monocrystalline silicon body 60 with a silicon dioxide layer 62 disposed thereon and with a monocrystalline silicon layer 64 overlying the silicon dioxide layer 62. The monocrystalline silicon layer 64 and the silicon dioxide layer 62 can each have a thickness which can be up to several microns. Portions of the monocrystalline silicon layer 64 will be used to form the relatively low acoustic impedance $Z_L$ material 24 for this example of the MEM resonator 10. Additionally, the monocrystalline silicon layer 64 can be doped for electrical conductivity (e.g. with phosphorous or boron) to also serve as the lower electrode 20' for the MEM resonator 10.

Figure 8B:
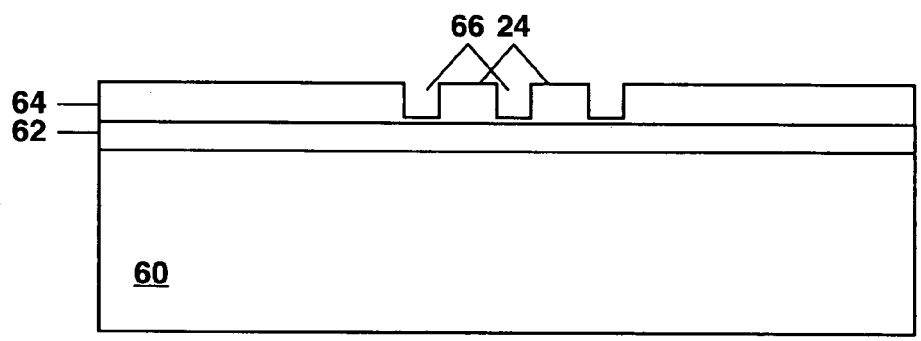

In FIG. 8B, a ring-shaped opening 66 (i.e. a trench) can be etched partway or entirely through the monocrystalline silicon layer 64 at each location wherein the relatively high acoustic impedance $Z_H$ material 26 is to be deposited. Portions of the monocrystalline silicon layer 64 between the ring-shaped openings 66 will form the relatively low acoustic impedance $Z_L$ material 24. Reactive ion etching can be used to form the ring-shaped openings 66 with a photolithographically defined etch mask (not shown) being used to protect portions of the monocrystalline silicon layer 64 which are to remain unetched.

Figure 8C:
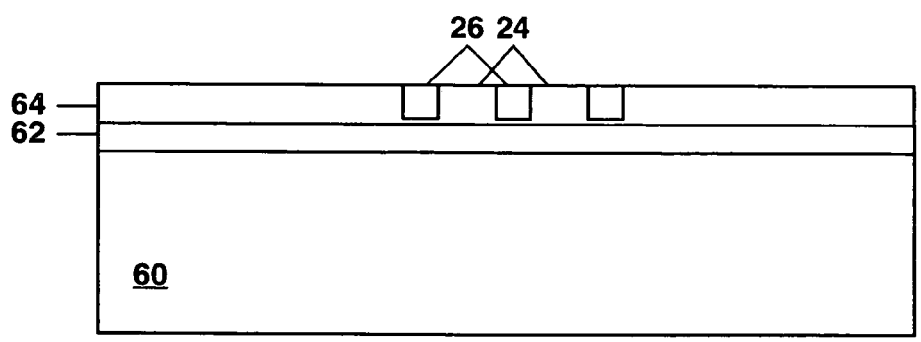

In FIG. 8C, tungsten can be blanket deposited over the SOI substrate 12 to fill in the openings 66 and form the relatively high acoustic impedance $Z_H$ material 26. This can be done as previously described with reference to FIG. 2F. Any tungsten overlying the monocrystalline silicon layer 64 can then be removed by a CMP step.

Figure 8D:
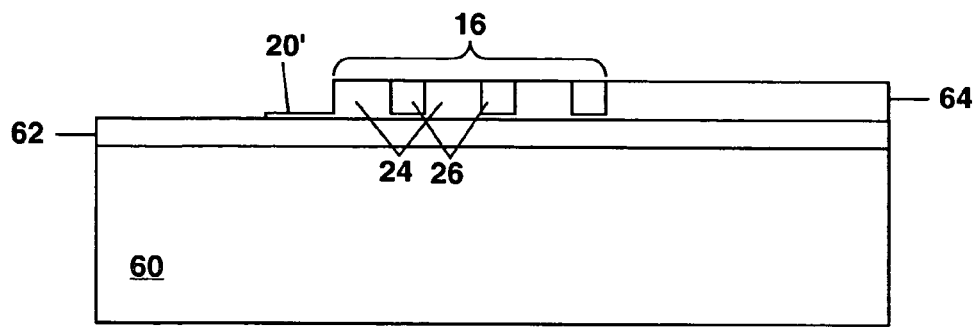

In FIG. 8D, the monocrystalline silicon layer 64 can be etched at a location inside the ring-shaped acoustic reflector 16 with a thin portion (e.g. 200-300 nm) of the monocrystalline silicon layer 64 being left in place to form the lower electrode 20' for the acoustic resonator 14. Etching of the monocrystalline silicon layer 64 in this step completes formation of the ring-shaped acoustic reflector 16.

Figure 8E:
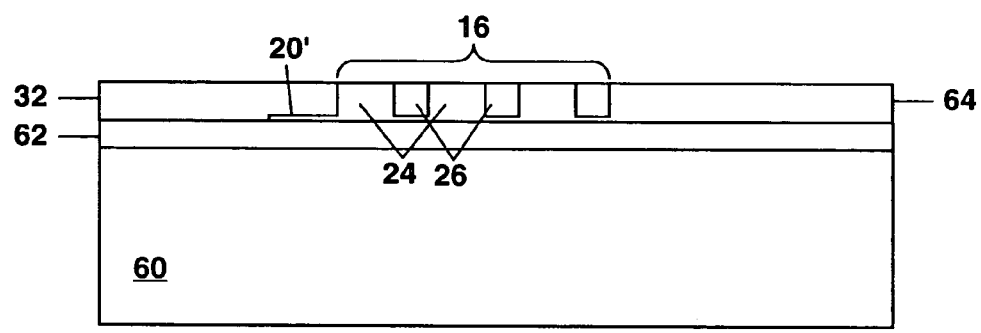

In FIG. 8E, one or more layers of silicon dioxide 32 can be blanket deposited over the SOI substrate 12 to fill in the location inside the ring-shaped acoustic reflector 16. The silicon dioxide 32 can be deposited using PECVD as described previously with reference to FIG. 2D, or alternately by LPCVD. The SOI substrate 12 can then be planarized down to the top of the monocrystalline silicon layer 64 using a CMP step.

Figure 8F:
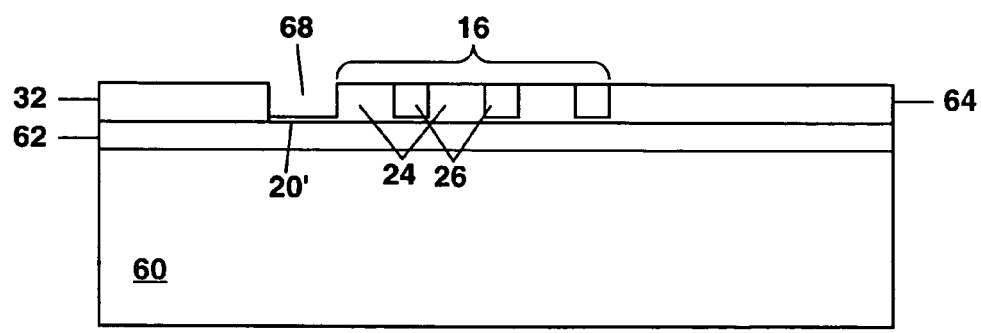

In FIG. 8F, after deposition and planarization of the silicon dioxide 32, a ring-shaped opening 68 can be etched down to the lower electrode 20' at a location where the acoustic resonator 14 will be formed. This can be done using reactive ion etching.

Figure 8G:
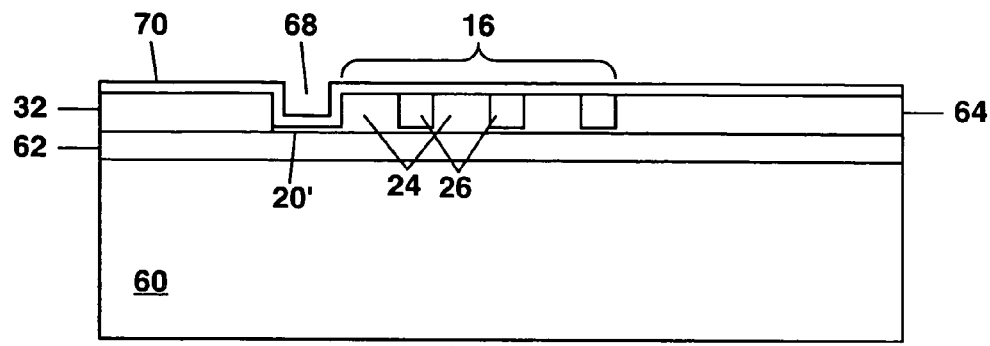

In FIG. 8G, an electrically-insulating layer 70 can be blanket deposited over the SOI substrate 12. The electrically-insulating layer 70 can comprise silicon nitride deposited by PECVD to a layer thickness of, for example, 200-300 nanometers. In other embodiments of the present invention, titanium dioxide or silicon dioxide can be used for the electrically-insulating layer 70. If silicon dioxide is used for the electrically-insulating layer 70, exposed portions of the layer 70 will need to be protected by an etch-resistant passivation layer (e.g. comprising photoresist or silicon nitride) during an etching step described hereinafter with reference to FIG. 8L when the other layers 32 and 62 comprising silicon dioxide are etched away to form the cavity 18.

Figure 8H:
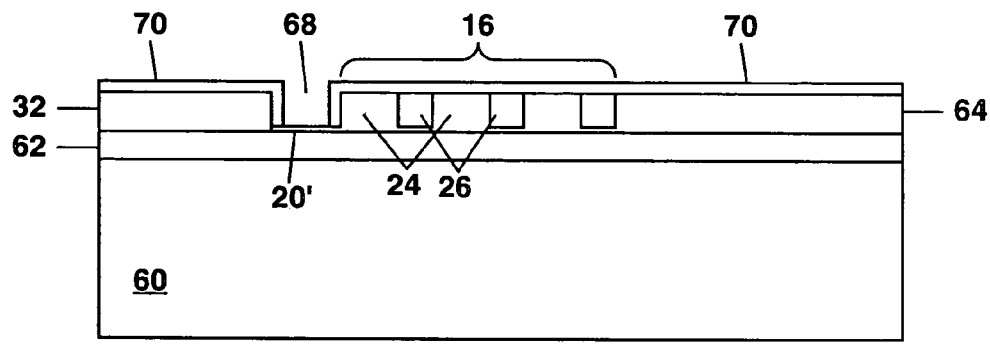

In FIG. 8H, a portion of the electrically-insulating layer 70 at the bottom of the ring-shaped opening 68 is removed to expose the lower electrode 20' in preparation for depositing the piezoelectric layer 30 which will be used to form the acoustic resonator 14. This can be done by a reactive ion etching step.

Figure 8I:
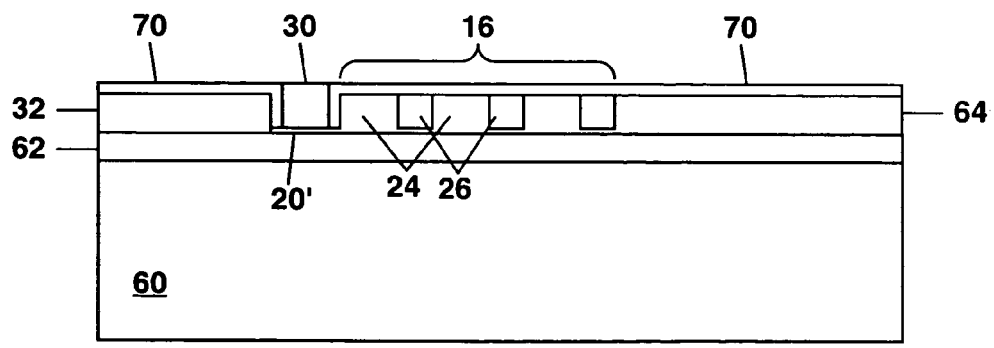

In FIG. 8I, the piezoelectric layer 30, which can comprise AlN, ZnO, or PZT, can be blanket deposited over the SOI substrate 12 to partially or completely fill in the ring-shaped opening 68. This can be done as described previously with reference to FIG. 2C. Any of the piezoelectric layer 30 extending upward beyond the electrically-insulating layer 70 can be removed by an etching or CMP step.

Figure 8J:
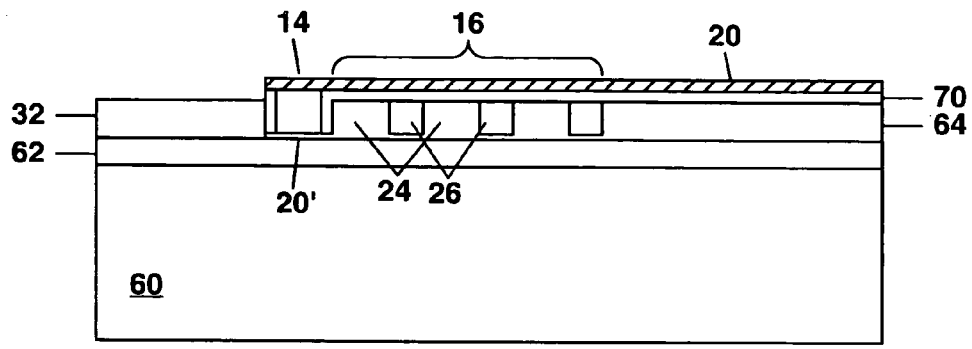

In FIG. 8J, the electrically-insulating layer 70 can be removed inside the ring-shaped acoustic resonator 14 to expose the underlying silicon dioxide. An opening 38 can also be formed through the electrically-insulating layer 70 to expose the monocrystalline silicon layer 64 to allow for the deposition of a metal portion of the lower electrode 20' (see FIG. 7A). The electrically-insulating layer 70 can be removed using a reactive ion etching step.

Figure 8K:
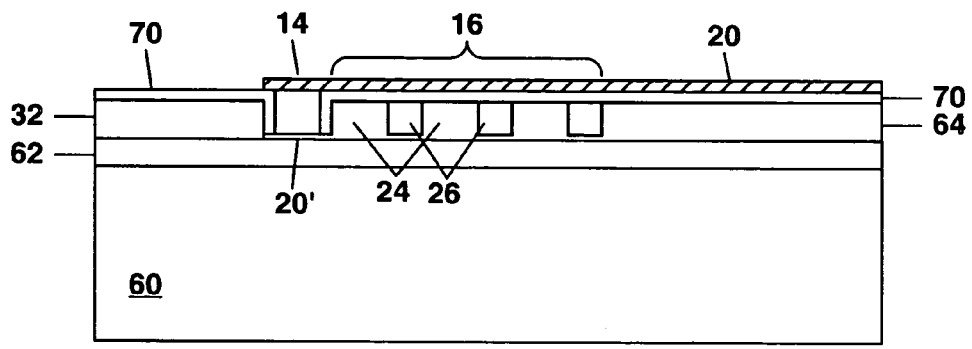

In FIG. 8K, the upper electrode 20 can be deposited on the SOI substrate 12 and patterned by reactive ion etching or lift-off. The upper electrode 20 can comprise about 200 nm of sputter-deposited aluminum. The same sputter-deposited aluminum can also be used to form the metal portion of the lower electrode 20' by being deposited in the opening 38 (see FIG. 7A).

Figure 8L:
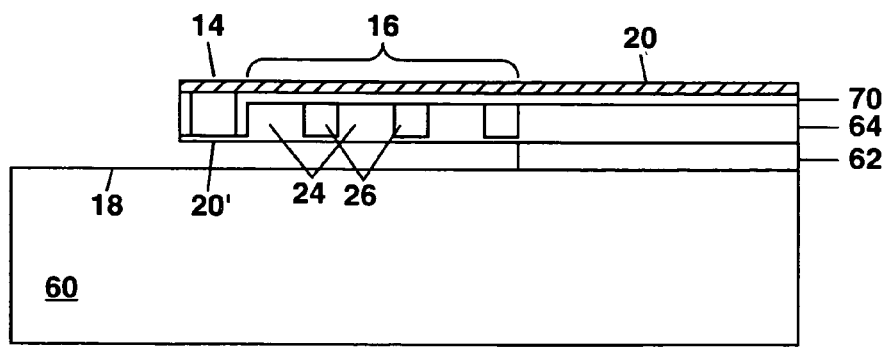

In FIG. 8L, the silicon dioxide 32 and the silicon dioxide layer 62 can be removed with an isotropic etchant comprising hydrofluoric acid (HF) in gaseous or liquid form to form the cavity 18. The HF etchant selectively removes silicon dioxide while not substantially etching the monocrystalline silicon body 60, the monocrystalline silicon layer 64, or other elements of the acoustic resonator 14 and the acoustic reflector 16 which are not made of silicon dioxide. The HF etchant can be timed to control an extent of undercutting beneath the acoustic reflector 16.

In the example of FIGS. 7A and 7B, a single upper electrode 20 is used. An oscillatory voltage V can be applied to the upper electrode 20 to electrically actuate the ring-shaped acoustic resonator 14 to produce a resonant acoustic signal therein corresponding to a particular width-extensional contour mode (e.g. the fundamental width-extensional contour mode). The lower electrode 20' can be left ungrounded and used as an output for an oscillatory electrical output signal which is generated in the ring-shaped acoustic resonator 14 by the resonant acoustic signal therein.

Figure 9A:
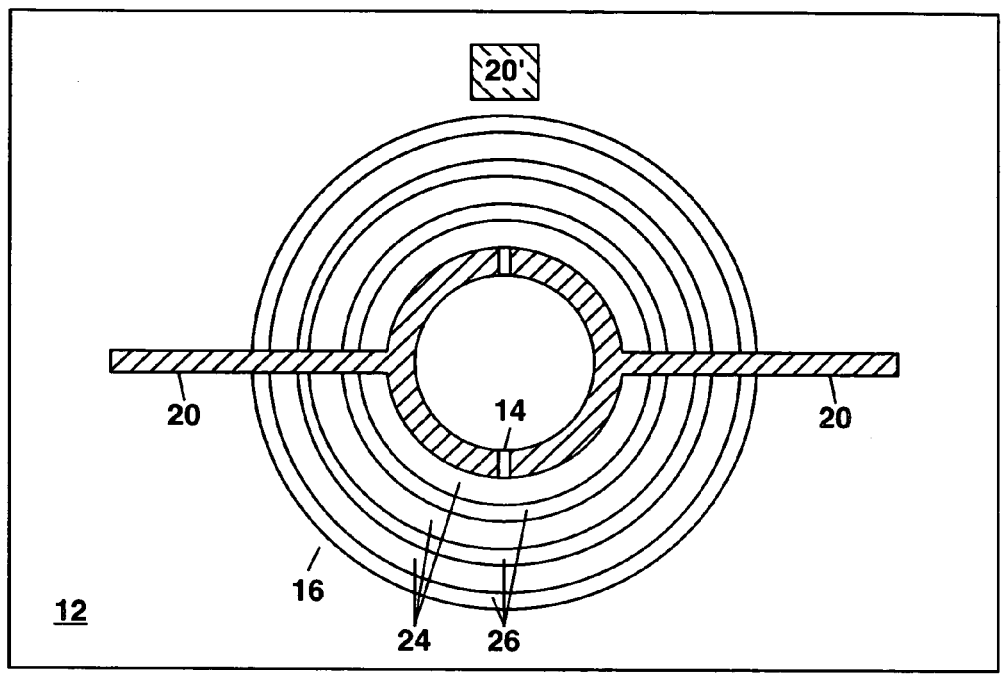
FIGS. 9A and 9B show schematic plan views of MEM resonators of the present invention having a pair of upper electrodes.
Figure 9B:
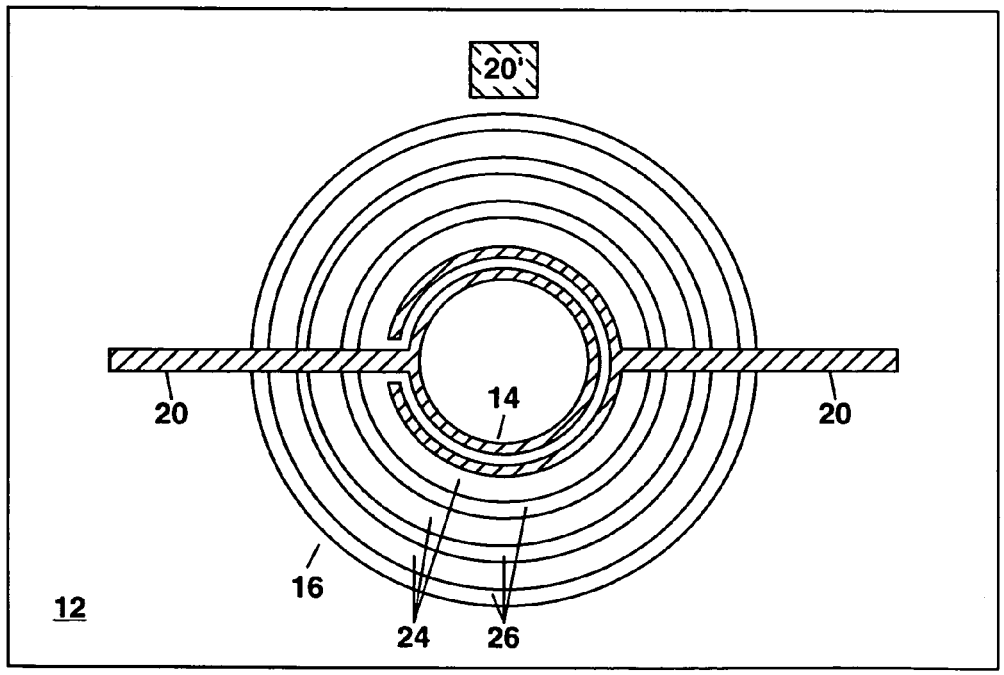

In other embodiments of the present invention, a pair of upper electrodes 20 can be provided in the ring-shaped MEM resonator 10 as shown in plan view in FIGS. 9A and 9B. In these examples of the present invention, the pair of upper electrodes 20 can comprise semi-circular electrodes 20 as shown in FIG. 9A, or can comprise concentric ring electrodes 20 as shown in FIG. 9B. When the upper electrodes 20 are formed as concentric ring electrodes 20, one of the upper electrodes 20 can be located proximate to an inner radius of the ring-shaped acoustic resonator 14, and with the other upper electrode 20 can be located proximate to an outer radius of the resonator 14.

In other embodiments of the present invention, the ring-shaped MEM resonator 10 can be electrostatically activated as previously described with reference to FIGS. 5A and 5B. Such an electrostatically activated device 10 can be formed as previously described with reference to FIGS. 6A-6L with the acoustic resonator 14 and the acoustic reflector 16 being ring-shaped rather than being linear.

Each of the MEM resonators 10 described herein can provide low impedances which are compatible with CMOS circuitry. This allows the MEM resonators 10 to be formed on a common substrate 12 with the CMOS circuitry (e.g. using post-CMOS processing). A resonant frequency for each MEM resonator 10 can be predetermined from the width of the acoustic resonator 14 therein, with the motional impedance being defined by the length of the linear acoustic resonator 14, or by the radius, r, of the ring-shaped acoustic resonator 14.

Although the various examples of MEM resonators 10 herein have been described as being electrically actuated (e.g. to form oscillators or rf filters), those skilled in the art will understand that these same devices 10 can be operated as sensors to detect resonant acoustic signals without any electrical actuation. In this sensing mode of operation, an incident acoustic signal can stimulate one or more width-extensional contour modes in the acoustic resonator 14 which then generates an oscillatory electrical output signal which can be sensed at the electrodes 20 and 20' in the MEM resonator 10. An incident acoustic signal having multiple acoustic frequencies can be detected using an array of MEM resonators 10 having resonators 14 therein of different sizes. The array of MEM resonators 10 can form, for example, an acoustic spectrum analyzer.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A microelectromechanical (MEM) resonator, comprising:
   a substrate;
   an acoustic resonator suspended on the substrate to produce a resonant acoustic signal in response to an electrical actuation; and
   an acoustic reflector located between the acoustic resonator and the substrate to provide an acoustic isolation of the acoustic resonator, with the acoustic reflector being formed as a cantilevered plate extending substantially parallel to the substrate, and with the acoustic reflector further comprising a plurality of elongate regions of two different materials arranged side-by-side in an alternating arrangement.

2. The apparatus of claim 1 wherein each elongate region has a width substantially equal to a one-quarter wavelength of the resonant acoustic signal, or an odd multiple thereof.

3. The apparatus of claim 1 wherein the substrate comprises silicon.

4. The apparatus of claim 1 wherein the acoustic resonator is separated from the substrate by an air gap.

5. The apparatus of claim 1 wherein the two different materials comprise tungsten and a material selected from the group consisting of silicon dioxide, aluminum nitride, and silicon.

6. The apparatus of claim 1 wherein the acoustic resonator comprises a piezoelectric material.

7. The apparatus of claim 6 wherein the piezoelectric material comprises aluminum nitride.

8. The apparatus of claim 1 wherein the acoustic resonator comprises an electrostatically-activated material.

9. The apparatus of claim 1 wherein the acoustic resonator is suspended over a cavity formed in the substrate.

10. The apparatus of claim 1 wherein the acoustic resonator further comprises a plurality of electrodes to provide the electrical actuation to produce the resonant acoustic signal, and to provide an oscillatory electrical output signal generated in the acoustic resonator by the resonant acoustic signal.

11. A microelectromechanical (MEM) resonator, comprising:
   a substrate;
   an acoustic resonator suspended on the substrate and having a ring shape, with the acoustic resonator producing a resonant acoustic signal in response to an electrical actuation thereof; and
   an acoustic reflector located between the acoustic resonator and the substrate to provide an acoustic isolation of the acoustic resonator, with the acoustic reflector having a ring shape and further comprising a plurality of nested rings of two different alternating materials.

12. The apparatus of claim 11 wherein each nested ring has a width which is substantially equal to a one-quarter wavelength of the resonant acoustic signal, or an odd multiple thereof.

13. The apparatus of claim 11 wherein the substrate comprises silicon.

14. The apparatus of claim 11 wherein the acoustic resonator is separated from the substrate by an air gap.

15. The apparatus of claim 11 wherein the two different alternating materials comprise tungsten and a material selected from the group consisting of silicon dioxide, aluminum nitride, and silicon.

16. The apparatus of claim 11 wherein the acoustic resonator comprises a piezoelectric material.

17. The apparatus of claim 16 wherein the piezoelectric material comprises aluminum nitride.

18. The apparatus of claim 11 wherein the acoustic resonator comprises an electrostatically-activated material.

19. The apparatus of claim 11 wherein the acoustic resonator is suspended over a cavity formed in the substrate.

20. The apparatus of claim 11 wherein the acoustic resonator further comprises a plurality of electrodes to provide the electrical actuation to produce the resonant acoustic signal, and to provide an oscillatory electrical output signal generated in the acoustic resonator by the resonant acoustic signal.

21. A microelectromechanical (MEM) resonator, comprising:
   a substrate having a cavity formed therein;
   an acoustic reflector formed as a plate and suspended at least partially over the cavity, and further comprising a plurality of elongate regions of a first material and a second material arranged side-by-side, with each elongate region having a width substantially equal to one-quarter of an acoustic wavelength; and
   an acoustic resonator attached to the acoustic reflector and suspended over the cavity to produce a resonant acoustic signal, with the acoustic resonator being substantially acoustically isolated from the substrate by the acoustic reflector.

22. The apparatus of claim 21 wherein the acoustic resonator comprises a contour mode resonator.

23. The apparatus of claim 21 wherein the acoustic resonator has a ring shape.

24. The apparatus of claim 21 wherein the first material comprises tungsten, and the second material comprises a material selected from the group consisting of silicon dioxide, silicon nitride and silicon.

25. The apparatus of claim 21 wherein the acoustic resonator comprises aluminum nitride.

26. A microelectromechanical (MEM) resonator, comprising:
   a substrate;
   a ring resonator extending outward over a cavity formed in the substrate to generate or detect a resonant acoustic signal; and
   an acoustic reflector located between the ring resonator and the substrate to acoustically decouple the ring resonator from the substrate, with the acoustic reflector further comprising a plurality of nested rings having two different alternating acoustic impedances, and with a width of each nested ring being substantially equal to a one-quarter wavelength of the resonant acoustic signal.

* * * * *